United States Patent
Gidney et al.

(10) Patent No.: US 11,966,814 B2
(45) Date of Patent: Apr. 23, 2024

(54) SURFACE CODE COMPUTATIONS USING AUTO-CCZ QUANTUM STATES

(71) Applicant: Google LLC, Mountain View, CA (US)

(72) Inventors: Craig Gidney, Goleta, CA (US); Austin Greig Fowler, Reseda, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/101,522

(22) Filed: Jan. 25, 2023

(65) Prior Publication Data

US 2023/0177373 A1 Jun. 8, 2023

Related U.S. Application Data

(63) Continuation of application No. 16/833,301, filed on Mar. 27, 2020, now Pat. No. 11,568,298.

(Continued)

(51) Int. Cl.
*G11C 11/40* (2006.01)
*G06F 7/48* (2006.01)
(Continued)

(52) U.S. Cl.
CPC ........... *G06N 10/00* (2019.01); *G06F 7/4824* (2013.01); *G06F 7/505* (2013.01); *G06F 7/5057* (2013.01);
(Continued)

(58) Field of Classification Search
CPC ....... G06N 10/00; G06F 7/4824; G06F 7/505; G06F 7/5057; G06F 7/72; G06F 17/10;
(Continued)

(56) References Cited

U.S. PATENT DOCUMENTS

| | | |
|---|---|---|
| 2015/0036967 A1 | 2/2015 | Smith et al. |
| 2015/0077821 A1* | 3/2015 | Smith ................... H04B 10/70 359/107 |

(Continued)

FOREIGN PATENT DOCUMENTS

| | | |
|---|---|---|
| AU | 2020253282 | 9/2021 |
| CA | 3043201 | 5/2018 |

(Continued)

OTHER PUBLICATIONS

Office Action in Australian Appln. No. 2022279429, dated May 10, 2023, 2 pages.

(Continued)

*Primary Examiner* — Xiaochun L Chen
(74) *Attorney, Agent, or Firm* — Fish & Richardson P.C.

(57) ABSTRACT

Methods and apparatus for performing surface code computations using Auto-CCZ states. In one aspect, a method for implementing a delayed choice CZ operation on a first and second data qubit using a quantum computer includes: preparing a first and second routing qubit in a magic state; interacting the first data qubit with the first routing qubit and the second data qubit with the second routing qubit using a first and second CNOT operation, where the first and second data qubits act as controls for the CNOT operations; if a received first classical bit represents an off state: applying a first and second Hadamard gate to the first and second routing qubit; measuring the first and second routing qubit using Z basis measurements to obtain a second and third classical bit; and performing classically controlled fixup operations on the first and second data qubit using the second and third classical bits.

18 Claims, 8 Drawing Sheets

Related U.S. Application Data

(60) Provisional application No. 62/826,142, filed on Mar. 29, 2019.

(51) Int. Cl.
    *G06F 7/505*         (2006.01)
    *G06F 7/72*          (2006.01)
    *G06F 17/10*        (2006.01)
    *G06N 10/00*       (2022.01)
    *G11C 11/4063*     (2006.01)
    *H04B 10/70*       (2013.01)

(52) U.S. Cl.
    CPC ............... *G06F 7/72* (2013.01); *G06F 17/10* (2013.01); *G11C 11/4063* (2013.01); *H04B 10/70* (2013.01)

(58) Field of Classification Search
    CPC ............. G06F 9/30007; G06F 9/30076; G11C 11/4063; H04B 10/70
    See application file for complete search history.

(56) References Cited

U.S. PATENT DOCUMENTS

| | | |
|---|---|---|
| 2018/0269906 A1 | 9/2018 | Haah et al. |
| 2022/0164695 A1 | 5/2022 | Morton et al. |

FOREIGN PATENT DOCUMENTS

| | | |
|---|---|---|
| CA | 3074557 | 3/2019 |
| CN | 101189627 | 5/2008 |
| CN | 106462808 | 2/2017 |
| CN | 107980145 | 5/2018 |
| CN | 108698815 | 10/2018 |
| CN | 113330464 | 8/2021 |

OTHER PUBLICATIONS

Office Action in Canadian Appln. No. 3,135,494, dated Dec. 5, 2023, 5 pages.
Alagic et al., "Status Report on the First Round of the NIST Post-Quantum Cryptography Standardization Process," Tech. Rep., National Institute of Standards and Technology, Jan. 2019, 27 pages.
apps.nsa.gov [online], "CNSA Suite and Quantum Computing FAQ," retrieved from URL <https://apps.nsa.gov/iaarchive/library/ia-guidance/ia-solutions-for-classified/algorithm-guidance/cnsa-suite-and-quantum-computing-faq.cfm>, Jan. 2016, 11 pages.
Babbush et al., "Encoding Electronic Spectra in Quantum Circuits with Linear T Complexity," Physical Review X, Oct. 2018, 041015-1-041015-36.
Barends et al., "Superconducting quantum circuits at the surface code threshold for fault tolerance," Nature, Apr. 2014, 508:500-503.
Beauregard, "Circuit for Shor's algorithm using 2n+3 qubits," https://arxiv.org/abs/quant-ph/0205095v1, May 2002, 13 pages.
Berry et al., "Qubitization of Arbitrary Basis Quantum Chemistry by Low Rank Factorization," https://arxiv.org/abs/1902.02134v1, Feb. 2019, 20 pages.
Bocharov et al., "Efficient Synthesis of Universal Repeat-Until-Success Circuits," https://arxiv.org/abs/1404.5320v1, Apr. 2014, 16 pages.
Braithwaite, "Experimenting with Post-Quantum Cryptography," retrieved from URL <https://security.googleblog.com/2016/07/experimenting-with-post-quantum.html>, Jul. 2016, 5 pages.
Bravyi et al., "Universal quantum computation with ideal Clifford gates and noisy ancillas," Physical Review A, Feb. 2005, 71:022316-1-022316-14.
Buhler et al., "Factoring integers with the number field sieve," in the Development of the Number Field Sieve, Lecture Notes in Mathematics (LNM), 1993, 1554:50-94.

Campbell et al., "Applying quantum algorithms to constraint satisfaction problems," https://arxiv.org/abs/1810.05582v1, Oct. 2018, 26 pages.
Cuccaro et al., "A new quantum ripple-carry addition circuit," https://arxiv.org/abs/quant-ph/0410184, Oct. 2004, 9 pages.
De Beaudrap et al., "The ZX calculus is a language for surface code lattice surgery," https://arxiv.org/abs/1704.08670v1, Apr. 2017, 19 pages.
Diffie et al., "New Directions in Cryptography," IEEE Transactions on Information Theory, Nov. 1976, 22(6):644-654.
Draper et al., "A logarithmic-depth quantum carry-lookahead adder," https://arxiv.org/abs/quant-ph/0406142, Jun. 2004, 21 pages.
Eastin, "Distilling one-qubit magic states into Toffoli states," Physical Review A, Mar. 2013, 87:032321-1-032321-7.
Ekera et al., "Quantum Algorithms for Computing Short Discrete Logarithms and Factoring RSA Integers," International Workshop on Post-Quantum Cryptography, Jun. 2017, 347-363.
Ekera, "Modifying Shor's algorithm to compute short discrete logarithms," retrieved from URL <https://eprint.iacr.org/2016/1128.pdf>, Dec. 2016, 26 pages.
Ekera, "On post-processing in the quantum algorithm for computing short discrete logarithms," retrieved from URL <https://eprint.iacr.org/2017/1122.pdf>, Feb. 2019, 19 pages.
Ekera, "Quantum algorithms for computing general discrete logarithms and orders with tradeoffs," retrieved from URL <https://eprint.iacr.org/2018/797.pdf>, Mar. 2020, 52 pages.
Ekera, "Revisiting Shor's quantum algorithm for computing general discrete logarithms," https://arxiv.org/abs/1905.09084, May 2019, 13 pages.
Fowler et al., "A bridge to lower overhead quantum computation," https://arxiv.org/abs/1209.0510v1, Sep. 2012, 15 pages.
Fowler et al., "Low overhead quantum computation using lattice surgery," https://arxiv.org/abs/1808.06709v1, Aug. 2018, 15 pages.
Fowler et al., "Surface codes: Towards practical large-scale quantum computation," Physical Review A, Sep. 2012, 86:032324-1-032324-48.
Fowler et al., "Surface code implementation of block code state distillation," Scientific Reports, Jun. 2013, 3(1939):1-6.
Fowler, "Time-optimal quantum computation," https://arxiv.org/abs/1210.4626v1, Oct. 2012, 5 pages.
Fowler, "Time-optimal quantum computation," https://arxiv.org/abs/1210.4626v3, last revised Feb. 2013, 5 pages.
Gheorghiu et al., "Quantum cryptanalysis of symmetric, public-key and hash-based cryptographic schemes," https://arxiv.org/abs/1902.02332v1, Feb. 2019, 19 pages.
Gidney et al., "Efficient magic state factories with a catalyzed |CCZ> to 2|T> transformation," https://arxiv.org/abs/1812.01238v1, Dec. 2018, 24 pages.
Gidney et al., "How to factor 2048 bit RSA integers in 7 hours using 23 million noisy qubits," https://arxiv.org/abs/1905.09749, last revised Dec. 2019, 26 pages.
Gidney et al., "How to factor 2048 bit RSA integers in 7 hours using 23 million noisy qubits," https://arxiv.org/abs/1905.09749v1, May 2019, 25 pages.
Gidney et al., "Efficient magic state factories with a catalyzed |CCZ> to 2|T> transformation," https://arxiv.org/abs/1812.01238v3, last revised Apr. 2019, 24 pages.
Gidney et al., "Flexible layout of surface code computations using AutoCCZ states," https://arxiv.org/abs/1905.08916, May 2019, 17 pages.
Gidney, "Factoring with n+2 clean qubits and n-1 dirty qubits," https://arxiv.org/abs/1706.07884v1, Jun. 2017, 13 pages.
Gidney, "Halving the cost of quantum addition," Quantum 2, Jun. 2018, 6 pages.
Gidney, "Approximate encoded permutations and piecewise quantum adders," https://arxiv.org/abs/1905.08488, May 2019, 15 pages.
Gidney, "Asymptotically Efficient Quantum Karatsuba Multiplication," https://arxiv.org/abs/1904.07356, Apr. 2019, 11 pages.
Gidney, "Windowed quantum arithmetic," https://arxiv.org/abs/1905.07682, May 2019, 11 pages.
Gillmor, "RFC 7919: Negotiated Finite Field Diffie-Hellman Ephemeral Parameters for Transport Layer Security (TLS)," retrieved from URL <https://www.hjp.at/doc/rfc/rfc7919.html>, Aug. 2016, 30 pages.

(56) References Cited

OTHER PUBLICATIONS github.com [online], "OpenSSL Software Foundation, Openssl source code: Line 32 of apps/dhparam.c," retrieved from URL <https://github.com/openssl/openssl/blob/07f434441e7ea385f975e8df8caa03e62222ca61/apps/dhparam.c#L32>, Dec. 2018, 6 pages.
github.com [online], "Quirk: A drag-and-drop quantum circuit simulator for exploring small quantum circuits," available on or before Jun. 11, 2018, via Internet Archive: Wayback Machine URL <https://web.archive.org/web/20180611035822/https://github.com/Strilanc/Quirk>, retrieved on Jun. 30, 2020, URL <https://github.com/Strilanc/Quirk>, 3 pages.
gnupg.org [online], "GnuPG frequently asked questions—11.2 Why Does GnuPG Default to 2048 bit RSA-2048?" available on or before Jul. 1, 2016, via Internet Archive: Wayback Machine URL <https://web.archive.org/web/20160701194147/https://www.gnupg.org/faq/gnupg-faq.html#default_rsa2048>, retrieved on Jun. 29, 2020, URL <https://www.gnupg.org/faq/gnupg-faq.html#default_rsa2048>, 22 pages.
Gordon, "Discrete logarithms in GF(p) using the Number Field Sieve," SIAM Journal on Discrete Mathematics, 1993, 6:124-138.
Gottesman et al., "Demonstrating the viability of universal quantum computation using teleportation and single-qubit operations," Nature, Nov. 1999, 402:390-393.
Gottesman, "The Heisenberg Representation of Quantum Computers," https://arxiv.org/abs/quant-ph/9807006, Jul. 1998, 20 pages.
Griffiths et al., "Semiclassical Fourier Transform for Quantum Computation," Physical Review Letters, Apr. 1996, 76(17):3228-3231.
Haah et al., "Codes and Protocols for Distilling T, controlled-S, and Toffoli Gates," Quantum 2, retrieved from URL <https://arxiv.org/abs/1709.02832v3>, May 2018, 29 pages.
Haner et al., "Factoring using 2n+2 qubits with Toffoli based modular multiplication," https://arxiv.org/abs/1611.07995v1, Nov. 2016, 7 pages.
Hastings et al., "Reduced Space-Time and Time Costs Using Dislocation Codes and Arbitrary Ancillas," https://arxiv.org/abs/1408.3379v1, Aug. 2014, 16 pages.
Horsman et al., "Surface code quantum computing by lattice surgery," New Journal of Physics, Dec. 2012, 28 pages.
Jeandel et al., "A Complete Axiomatisation of the ZX-Calculus for Clifford+T Quantum Mechanics," Proceedings of the 33rd Annual ACM/IEEE Symposium on Logic in Computer Science, Jul. 2018, 10 pages.
Jones, "Composite Toffoli gate with two-round error detection," Physical Review A, May 2013, 87(5):052334-1-052334-8.
Jones, "Low-overhead constructions for the fault-tolerant Toffoli gate," Physical Review A, Feb. 2013, 022328-1-022328-4.
Karatsuba et al., "Multiplication of many-digital numbers by automatic computers," Doklady Akademii Nauk, Russian Academy of Sciences, Feb. 1962, 145(2):293-294 (with English translation).
keylength.com [online], "BlueKrypt—Cryptographic Key Length Recommendation," available on or before Mar. 3, 2019, via Internet Archive: Wayback Machine URL <https://web.archive.org/web/20190303042857/https://www.keylength.com/>, retrieved on Jun. 29, 2020, URL <https://www.keylength.com>, 1 page.
Kim et al., "Flipping bits in memory without accessing them: An experimental study of DRAM disturbance errors," 2014 ACM/IEEE 41st International Symposium on Computer Architecture (ISCA), Jun. 2014, 12 pages.
Kitaev, "Fault-tolerant quantum computation by anyons," Annals of Physics, Jan. 2003, 303(1):2-30.
Kivinen et al., "RFC 3526: More Modular Exponentiation (MODP) Diffie-Hellman groups for Internet Key Exchange (IKE)," retrieved from URL <https://www.hjp.at/doc/rfc/rfc3526.html>, May 2003, 11 pages.
Kleinjung et al., "Factorization of a 768-Bit RSA Modulus," Lecture Notes in Computer Science: Advanced in Cryptology: CRYPTO 2010, 2010, 6223:333-350.

Lenstra et al., "Selecting Cryptographic Key Sizes," Journal of Cryptology, 2001, 14:225-293.
Lenstra et al., "The No. field sieve," Proceedings of the 22nd Annual ACM Symposium on the Theory of Computing (STOC), 1990, 564-572.
Lenstra, "Key Lengths," The Handbook of Information Security, retrieved from URL <http://citeseerx.ist.psu.edu/viewdoc/download;jsessionid=F4B43E1DEB9BD699C0F03EA08A2AD810?doi=10.1.1.694.8206&rep=rep1&type=pdf>, 2004, 32 pages.
Li, "A magic state's fidelity can be superior to the operations that created it," New Journal of Physics, Feb. 2015, 17:1-7.
linux.die.net [online], "ssh-keygen(1)—Linux man page," available on or before Mar. 25, 2018, via Internet Archive: Wayback Machine URL <https://web.archive.org/web/20180325042106/https://linux.die.net/man/1/ssh-keygen>, retrieved on Jun. 29, 2020, URL <https://linux.die.net/man/1/ssh-keygen>, 3 pages.
listserv.nodak.edu [online], "795-bit factoring and discrete logarithms," retrieved from URL <https://listserv.nodak.edu/cgi-bin/wa.exe?A2=NMBRTHRY;fd743373.1912&FT=M&P=T&H=&S=>, Dec. 2, 2019, 2 pages.
Litinski, "A Game of Surface Codes: Large-Scale Quantum Computing with Lattice Surgery," https://arxiv.org/abs/1808.02892v1, Aug. 2018, 35 pages.
Litinski, "Magic State Distillation: Not as Costly as You Think," https://arxiv.org/abs/1905.06903v1, May 2019, 20 pages.
Low et al., "Trading T-gates for dirty qubits in state preparation and unitary synthesis," https://arxiv.org/abs/1812.00954, Dec. 2018, 11 pages.
Mosca et al., "The Hidden Subgroup Problem and Eigenvalue Estimation on a Quantum Computer," Proceeding from the First NASA International Conference: Quantum Computing and Quantum Communications (QCQC1998), May 1999, 1509:174-188.
Mosca, "Cybersecurity in an Era with Quantum Computers: Will We Be Ready?" IEEE Security & Privacy, Oct. 2018, 16(5): 38-41 (2018).
NIST and CCCS, "Implementation Guidance for FIPS 140-2 and the Cryptographic Module Validation Program," retrieved from URL <https://web.archive.org/web/20190313055345/https://csrc.nist.gov/csrc/media/projects/cryptographic-module-validation-program/documents/fips140-2/fips1402ig.pdf, Feb. 5, 2019, 240 pages.
NIST, "Recommendation for Key Management, Part 1: General (SP 800-57 Part 1 Rev. 4)," retrieved from URL <https://nvlpubs.nist.gov/nistpubs/SpecialPublications/NIST.SP.800-57pt1r4.pdf>, Jan. 2016, 161 pages.
NIST, "Recommendation for Pair-Wise Key-Establishment Schemes Using Discrete Logarithm Cryptography (SP 800-56A Rev. 3)," retrieved from URL <https://nvlpubs.nist.gov/nistpubs/SpecialPublications/NIST.SP.800-56Ar3.pdf>, Apr. 2018, 152 pages.
NIST, "Digital Signature Standard (DSS) (FIPS PUB 186-4)," retrieved from URL <https://nvlpubs.nist.gov/nistpubs/FIPS/NIST.FIPS.186-4.pdf>, Jul. 2013, 130 pages.
Office Action in Australian Appln. No. 2020253282, dated Jun. 29, 2022, 3 pages.
O'Gorman et al., "Quantum computation with realistic magic-state factories," Physical Review A, Mar. 2017, 032338-1-032338-19.
Paetznick et al., "Universal Fault-Tolerant Quantum Computation with Only Transversal Gates and Error Correction," Physical Review Letters, Aug. 2013, 111(9):090505-1-090505-5.
Paler et al., "Fault-tolerant, high-level quantum circuits: form, compilation and description," Quantum Science and Technology, Apr. 2017, 2(2):1-17.
Parent et al., "Improved reversible and quantum circuits for Karatsuba-based integer multiplication," https://arxiv.org/abs/1706.03419, Jun. 2017, 16 pages.
Parker et al., "Efficient Factorization with a Single Pure Qubit and log N Mixed Qubits," Physical Review Letters, Oct. 2000, 85(14):3049-3052.
Invitation to Pay Additional Fees in International Appln. No. PCT/US2020/025473, dated Jul. 23, 2020, 20 pages.
International Search Report and Written Opinion in International Appln. No. PCT/US2020/025473, dated Sep. 16, 2020, 25 pages.

(56) References Cited

OTHER PUBLICATIONS

Pohlig et al., "An Improved Algorithm for Computing Logarithms over GF(p) and Its Cryptographic Significance," IEEE Transactions on Information Theory, Jan. 1978, 24(1): 106-110.

Pollard, "Factoring with cubic integers," Lecture Notes in Mathematics: The Development of the Number Field Sieve, Oct. 2006, 4-10.

Pollard, "Monte Carlo Methods for Index Computation (mod p)," Mathematics of Computation, Jul. 1978, 32(143):918-924.

Pollard, "The lattice sieve," The Development of the Number Field Sieve, Lecture Notes in Mathematics (LNM), 1993, 1554:43-49.

Pomerance, "A Tale of Two Sieves," Notices of the AMS, Dec. 1996, 43(12):1473-1485.

Raussendorf et al., "A fault-tolerant one-way quantum computer," Annals of Physics, Sep. 2006, 321(9):2242-2270.

Raussendorf et al., "Fault-Tolerant Quantum Computation with High Threshold in Two Dimensions," Physical Review Letters 98, May 2007, 190504-1-190504-4.

Rivest et al., "A method for obtaining digital signatures and public-key cryptosystems," Communications of the ACM, Feb. 1978, 21(2):120-126.

Roetteler et al., "Quantum Resource Estimates for Computing Elliptic Curve Discrete Logarithms," Proceedings of the 23rd International Conference on the Theory and Application of Cryptology and Information Security: Advances in Cryptology (ASIACRYPT 2017), Lecture Notes in Computer Science (LNCS), Nov. 2017, 10625:241-270.

Schirokauer, "Discrete Logarithms and Local Units," Philosophical Transactions of the Royal Society A, Nov. 1993, 345(1676):409-423.

Schonhage et al., "Schnelle Multiplikation großer Zahlen," Computing 7, Sep. 1971, 281-292 (with English summary).

Schroeder et al., "DRAM Errors in the Wild: A Large-Scale Field Study," ACM SIGMETRICS Performance Evaluation Review, Jun. 2009, 37, 193-204.

Shor, "Algorithms for quantum computation: Discrete logarithms and factoring," Proceedings 35th Annual Symposium on Foundations of Computer Science, Nov. 1994, 124-134.

smartcardfocus.com [online], "JavaCOS A22 dual interface Java card—150K," available on or before Dec. 18, 2016, via Internet Archive: Wayback Machine URL <https://web.archive.org/web/20161218155914/http://www.smartcardfocus.com/shop/ilp/id~712/javacos-a22-dual-interface-java-card-150k/p/index.shtml>, retrieved on Jun. 29, 2020, URL <https://www.smartcardfocus.com/shop/ilp/id~712/javacos-a22-dual-interface-java-card-150k/p/index.shtml>, 1 page.

Van Meter et al., "Fast quantum modular exponentiation," Physical Review A, May 2005, 71:052320-1-052320-12.

Van Oorschot et al., "On Diffie-Hellman Key Agreement with Short Exponents," Proceedings of the International Conference on the Theory and Applications of Cryptographic Techniques, Advanced in Cryptology (EUROCRYPT 1996), 1996, 1070:332-343.

Vedral et al., "Quantum networks for elementary arithmetic operations," Physical Review A, Jul. 1996, 147-153.

wikipedia.org [online], "Timeline of quantum computing," available on or before Nov. 19, 2018, via Internet Archive: Wayback Machine URL <https://web.archive.org/web/20181119015658/https://en.wikipedia.org/wiki/Timeline_of_quantum_computing>, retrieved on Jun. 30, 2020, URL <https://en.wikipedia.org/wiki/Timeline_of_quantum computing>, 13 pages.

Zalka, "Fast versions of Shor's quantum factoring algorithm," https://arxiv.org/abs/quant-ph/9806084, Jun. 1998, 37 pages.

Zalka, "Shor's algorithm with fewer (pure) qubits," https://arxiv.org/abs/quant-ph/0601097, Jan. 2006, 12 pages.

Fu et al., "QASM: An Executable Quantum Instruction Set Architecture" 2019 IEEE International Symposium on High Performance Computer Architecture, Mar. 28, 2019, 224-237.

Hanmin, "The Design of Drive Circuit for the Phase Modulator of Quantum Cryptography Communications Based On BB84 Protocol" Master's degree thesis in China Information and Technology Series, No. 07, Jul. 15, 2011, 80 pages (with English abstract).

Huang, "Research on the linear optical quantum computing" a Dissertation for the Degree of Military Science, PLA Strategic Support Information Engineering University, Apr. 2018, 162 pages (with English abstract).

Mandviwalla et al., "Implementing Grover's Algorithm on the IBM Quantum Computers" 2018 IEEE International Conference on Big Data (Big Data), Jan. 24, 2019, 2531-2537.

Notice of Allowance in Australian Appln. No. 2022279429, mailed on Feb. 14, 2024, 3 pages.

Notice of Allowance in Chinese Appln. No. 202080026132.5, mailed on Jan. 24, 2024, 11 pages (with English translation).

Sijia, "Research on the Key Theory of Quantum State Private Transmission" Full text of doctoral thesis in China Basic science, May 15, 2019, 134 pages (with English abstract).

Terhal, "Quantum error correction for quantum memories" Reviews of Modern Physics, Apr. 7, 2015, 47 pages.

Wang, "Parallel Quantum Computing Teleportation for Spin Qubits in Quantum Dot and Microcavity Coupled System" IEEE Journal of Selected Topics in Quantum Electronics, May 2, 2014, 7 pages.

Yi, "Research on Quantum Algorithms for Image Processing" a Dissertation for the degree of Doctor of Engineering in computer science and technology, National University of Defense Technology, Oct. 2014, 182 pages (with English abstract).

* cited by examiner

SURFACE CODE COMPUTATIONS USING AUTO-CCZ QUANTUM STATES

CROSS-REFERENCE TO RELATED APPLICATIONS

This application is a continuation of U.S. patent application Ser. No. 16/833,301, filed Mar. 27, 2020, which claims the benefit of the filing date of U.S. Provisional Application No. 62/826,142, filed Mar. 29, 2019. The disclosures of the prior applications are considered part of and are incorporated by reference in the disclosure of this application.

BACKGROUND

This specification relates to quantum computing.

Classical computers have memories made up of bits, where each bit can represent either a zero or a one. Quantum computers maintain sequences of quantum bits, called qubits, where each quantum bit can represent a zero, one or any quantum superposition of zeros and ones. Quantum computers operate by setting qubits in an initial state and controlling the qubits, e.g., according to a sequence of quantum logic gates.

SUMMARY

This specification describes various methods, systems and apparatus for performing surface code computations using Auto-CCZ states.

In general, one innovative aspect of the subject matter described in this specification can be implemented in a method for implementing a delayed choice CZ operation on a first data qubit and a second data qubit using a quantum computer, the method comprising: preparing a first routing qubit and a second routing qubit in a magic state; interacting i) the first data qubit with the first routing qubit, and ii) the second data qubit with the second routing qubit using a first CNOT operation and a second CNOT operation, respectively, wherein the first data qubit and second data qubit act as a first control and a second control for the first CNOT operation and the second CNOT operation, respectively; storing the first routing qubit and second routing qubit; receiving, from a classical processor, a first classical bit; determining whether the first classical bit represents an off state or an on state; in response to determining that the first classical bit represents an off state: applying a first Hadamard gate to the first routing qubit and applying a second Hadamard gate to the second routing qubit; measuring the first routing qubit using a Z basis measurement to obtain a second classical bit measuring the second routing qubit using a Z basis measurement to obtain a third classical bit; and performing classically controlled fix up operations on the first data qubit and second data qubit using the second classical bit and the third classical bit.

Other implementations of these aspects includes corresponding computer systems, apparatus, and computer programs recorded on one or more computer storage devices, each configured to perform the actions of the methods. A system of one or more classical and quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations performing classically controlled fix up operations on the first data qubit and the second data qubit using the second classical bit and the third classical bit comprises: applying a classically controlled swap operation to the second classical bit and third classical bit, wherein the first classical bit acts as a control for the classically controlled swap operation; and applying a first classically controlled Z operation to the second data qubit, wherein the third classical bit acts as a control for the first classically controlled Z operation; and applying a second classically controlled Z operation to the first data qubit, wherein the second classical bit acts as a control for the second classically controlled Z operation.

In some implementations the method further comprises, in response to determining that the first classical bit represents an on state: measuring the first routing qubit using a Z basis measurement to obtain a fourth classical bit; measuring the second routing qubit using a Z basis measurement to obtain a fifth classical bit; and performing classically controlled fix up operations on the first data qubit and second data qubit using the obtained fourth classical bit and fifth classical bit.

In some implementations performing classically controlled fix up operations on the first data qubit and the second data qubit comprises: applying a classically controlled swap operation to the fourth classical bit and fifth classical bit, wherein the first classical bit acts as a control for the classically controlled swap operation; and applying a first classically controlled Z operation to the second data qubit, wherein the fifth classical bit acts as a control for the first classically controlled Z operation; and applying a second classically controlled Z operation to the first data qubit, wherein the fourth classical bit acts as a control for the second classically controlled Z operation.

In some implementations preparing a first routing qubit and a second routing qubit in a magic state comprises: preparing the first routing qubit in a plus state; preparing the second routing qubit in a plus state; and performing a CZ operation on the first routing qubit and the second routing qubit.

In some implementations the first classical bit comprises an output of a classical computation that determines whether or not a classical controlled Z operation is to be performed on the first data qubit and second data qubit.

In general, another innovative aspect of the subject matter described in this specification can be implemented in a method for implementing an auto corrected CCZ operation on a first, second and third data qubit using a quantum computer, the method comprising: preparing nine routing qubits in a magic state; interacting i) the first data qubit with a first routing qubit using a first CNOT operation, ii) the second data qubit with a fourth routing qubit using a second CNOT operation, and iii) the third data qubit with a seventh routing qubit using a third CNOT operation, wherein the first data qubit acts as a control for the first CNOT operation, the second data qubit acts as a control for the second CNOT operation, and the third data qubit acts as a control for the third CNOT operation; measuring the first, fourth and seventh routing qubits to obtain a first, fourth and seventh classical bit; storing the second routing qubit, third routing qubit, fifth routing qubit, sixth routing qubit, eighth routing qubit and ninth routing qubit; determining whether the first classical bit represents an off state or an on state; in response to determining that the first classical bit represents an on state, applying a first Hadamard gate to the fifth routing qubit and applying a second Hadamard gate to the sixth routing qubit; measuring the fifth routing qubit using a Z basis measurement to obtain a fifth classical bit and measuring the sixth routing qubit using a Z basis measurement to obtain a sixth classical bit; determining whether the fourth classical bit represents an off state or an on state; in response to determining that the fourth classical bit represents an on state, applying a third Hadamard gate to the eighth routing qubit and applying a fourth Hadamard gate to the ninth routing qubit; measuring the eighth routing qubit using a Z basis measurement to obtain a eighth classical bit and measuring the ninth routing qubit using a Z basis measurement to obtain a ninth classical bit; determining whether the seventh classical bit represents an off state or an on state; in response to determining that the seventh classical bit represents an on state, applying a fifth Hadamard gate to the second routing qubit and applying a sixth Hadamard gate to the third routing qubit; measuring the second routing qubit using a Z basis measurement to obtain a second classical bit and measuring the third routing qubit using a Z basis measurement to obtain a third classical bit; and performing classically controlled fix up operations on the first, second and third data qubits using each of the classical bits.

Other implementations of these aspects includes corresponding computer systems, apparatus, and computer programs recorded on one or more computer storage devices, each configured to perform the actions of the methods. A system of one or more classical and quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations preparing nine routing qubits in a magic state comprises: preparing each of the nine routing qubits in a plus state; performing a CCZ operation on the first, fourth and seventh routing qubits; performing CZ operations on pairs of neighboring routing qubits.

In some implementations the method further comprises, in response to determining that the first classical bit represents an off state: measuring the fifth routing qubit using a Z basis measurement to obtain a tenth classical bit; measuring the sixth routing qubit using a Z basis measurement to obtain a eleventh classical bit; in response to determining that the fourth classical bit represents an off state: measuring the eighth routing qubit using a Z basis measurement to obtain a twelfth classical bit; measuring the ninth routing qubit using a Z basis measurement to obtain a thirteenth classical bit; in response to determining that the seventh classical bit represents an off state: measuring the second routing qubit using a Z basis measurement to obtain a fourteenth classical bit; measuring the third routing qubit using a Z basis measurement to obtain a fifteenth classical bit; and performing classically controlled fix up operations on the first, second and third data qubits using each of the tenth-fifteenth classical bits.

In some implementations performing classically controlled fix up operations on the first, second and third data qubits comprises: applying a first classically controlled swap operation to the second classical bit and third classical bit, wherein the seventh classical bit acts as a control for the first classically controlled swap operation; applying a second classically controlled swap operation to the fifth classical bit and sixth classical bit, wherein the first classical bit acts as a control for the second classically controlled swap operation; applying a third classically controlled swap operation to the eighth classical bit and ninth classical bit, wherein the fourth classical bit acts as a control for the third classically controlled swap operation; applying multiple classically controlled Z operations to the first, second, and third data qubits, wherein each classically controlled Z operation uses one of the second, third, fifth, sixth, eighth or ninth classical bits as a control for the classically controlled Z operation; applying multiple classically controlled-controlled Z operations to the first, second and third data qubits, wherein each classically controlled-controlled Z operation uses two of the first, fourth and seventh classical bits as controls for the classically controlled-controlled Z operation.

In some implementations applying multiple classically controlled Z operations to the first, second, and third data qubits, wherein each classically controlled Z operation uses one of the second, third, fifth, sixth, eighth or ninth classical bits as a control for the classically controlled Z operation, comprises: applying a first classically controlled Z operation to the third data qubit, wherein the second classical bit acts as a control for the first classically controlled Z operation; applying a second classically controlled Z operation to the second data qubit, wherein the third classical bit acts as a control for the second classically controlled Z operation; applying a third classically controlled Z operation to the third data qubit, wherein the fifth classical bit acts as the control for the third classically controlled Z operation; applying a fourth classically controlled Z operation to the first data qubit, wherein the sixth classical bit acts as the control for the fourth classically controlled Z operation; applying a fifth classically controlled Z operation to the second data qubit, wherein the eighth classical bit acts as the control for the fifth classically controlled Z operation; and applying a sixth classically controlled Z operation to the first data qubit, wherein the ninth classical bit acts as the control for the sixth classically controlled Z operation.

In some implementations applying multiple classically controlled-controlled Z operations to the first, second and third data qubits, wherein each classically controlled-controlled Z operation uses two of the first, fourth and seventh classical bits as controls for the classically controlled-controlled Z operation, comprises: applying a first classically controlled-controlled Z operation to the first data qubit, wherein the first classical bit and fourth classical bit act as controls for the first classically controlled-controlled Z operation; applying a second classically controlled-controlled Z operation to the second data qubit, wherein the fourth classical bit and seventh classical bit act as controls for the second classically controlled-controlled Z operation; and applying a third classically controlled-controlled Z operation to the third data qubit, wherein the first classical bit and seventh classical bit act as controls for the third classically controlled-controlled Z operation.

In general, another innovative aspect of the subject matter described in this specification can be implemented in a method for producing a target state, the method comprising: obtaining a first number of T states of a first quality; distilling the first number of T states of the first quality into a second number of T states of a second quality, wherein the second number is smaller than the first number and the second quality is higher than the first quality; applying, using the second number of T states of the second quality, an error detecting operation to a tensor product of plus states to obtain the target state, wherein the second number of T states are provided for use in the error detecting operation at least partially in parallel with stabilizer measurements performed during the error detecting operation.

Other implementations of these aspects includes corresponding computer systems, apparatus, and computer programs recorded on one or more computer storage devices, each configured to perform the actions of the methods. A system of one or more classical and quantum computers can be configured to perform particular operations or actions by virtue of having software, firmware, hardware, or a combination thereof installed on the system that in operation causes or cause the system to perform the actions. One or more computer programs can be configured to perform particular operations or actions by virtue of including instructions that, when executed by data processing apparatus, cause the apparatus to perform the actions.

The foregoing and other implementations can each optionally include one or more of the following features, alone or in combination. In some implementations the first number of T states comprises at least 15×8 T states, and wherein the second number of T states comprises 8 T states.

In some implementations the target state comprises a CCZ state, and wherein the error detecting operation comprises a error detecting CCZ operation.

In some implementations the CCZ state is produced using a CCZ factory of depth 5d, where d represents error correcting code distance.

In some implementations distilling the first number of T states of the first quality into a second number of T states of a second quality is performed by multiple T factories, and wherein each T factory receives the first number of T states of the first quality at least partially in parallel with stabilizer measurements performed by the T factory.

In general, another innovative aspect of the subject matter described in this specification can be implemented in an apparatus for performing an addition operation, the apparatus comprising: a register comprising a plurality of qubits, wherein the plurality of qubits are arranged in a two-dimensional array comprising multiple rows, wherein each row is associated with a value at a respective position in a sequence of n bits, wherein the sequence of bits represents a binary numeric value, and wherein a top row of qubits is associated with a value representing a most significant bit in the sequence of n bits, and decreasingly lower rows of qubits are associated with respective values representing increasingly significant bits in the sequence of n bits; and a plurality of CCZ factories that surround an operating area, wherein the operating area comprises an area in which the multiple rows of qubits are operated on to perform the addition operation, and wherein the CCZ factories are separated in space by gaps to allow qubits to be routed into and through the operating area, wherein during an addition operation, for each row of qubits in the two-dimensional array and starting with a row of qubits at the bottom of the two-dimensional array: qubits in the row are moved through one or more of the gaps and into the operating area where an addition operation is performed using the qubits in the row, and after the addition operation is performed, the qubits in the row are moved through and out of the operating area.

The foregoing and other implementations can each optionally include one or more of the following features, alone or in combination. In some implementations the register comprises a target register and a lookup output register that are interleaved to allow qubits in each register to be operated on pairwise. In some implementations, within each row, the qubits are interleaved to line up with the gaps.

In general, another innovative aspect of the subject matter described in this specification can be implemented in an apparatus for performing a lookup operation, the apparatus comprising: a plurality of CCZ factories that feed autoCCZ states into a first operating area, wherein the first operating area comprises an area in which the lookup operation is performed; and a lookup output register comprising plurality of lookup output qubits, wherein the plurality of lookup output qubits are arranged in two-dimensional array comprising multiple rows, wherein each row is associated with a value at a respective position in a sequence of n bits, wherein the sequence of bits represents a binary numeric value, and wherein a top row of qubits in the two-dimensional array is associated with a value representing a most significant bit in the sequence of n bits, and decreasingly lower rows of qubits in the two-dimensional array are associated with respective values representing decreasingly significant bits in the sequence of n bits, wherein each lookup output qubit is adjacent to one or more second operating areas that are positioned between rows in the two-dimensional array and that extend from approximately a vertical center of the multiple rows to one of two sides of the two-dimensional array, and wherein third operating areas positioned at each side of the two-dimensional array connect the second operating areas to the first operating area.

The foregoing and other implementations can each optionally include one or more of the following features, alone or in combination. In some implementations the apparatus further comprises a target register of qubits interleaved between rows of lookup output qubits, wherein the target register is idle during the lookup operation. In some implementations the apparatus further comprises a factor register of qubits comprising a first plurality of qubits that are idle and a second plurality of qubits that are used as address bits in the lookup operation, wherein the factor register is adjacent to the plurality of CCZ factories and separate from the first operating area.

The subject matter described in this specification can be implemented in particular ways so as to realize one or more of the following advantages.

A quantum computer implementing the presently described techniques can perform reaction limited computations with reduced space overhead. For example, the spacetime volume of CZ operations is reduced by a factor of 4 compared to known techniques for performing CZ operations. In addition, reaction limited computations can be performed with improved qubit routing—qubit routing is easier due to a decoupling of the consumption of a CCZ state from required fixup operations needed to complete a gate teleportation and less routing qubits are needed.

In addition, computations that use the presently described Auto-CCZ states (instead of standard CCZ states) can achieve improved efficiency, since under the Auto-CCZ construction fixup operations are automatically performed and do not require conditional insertion of CZ gates based on measurements.

In addition, the presently described techniques include efficient spacetime hardware layouts for depth-limited circuits, e.g., ripple-carry additions, and Clifford-limited circuits, e.g., QROM reads. The layouts account for distillation and routing, and are suitable for both intermediate scale quantum computers and future quantum computers, e.g., large-scale superconducting qubit platforms.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Overview

Performing error corrected quantum computations involves implementing sequences of unitary operations and measurements, where intermediate measurement results are used to determine future unitary operations. For example, in the surface code, performing logical T and Tt gates involves a measurement dependent future S gate.

The measurement depth of a quantum circuit (defined as the minimum number of T gates implemented sequentially to complete execution) determines how many times a classical control system will: perform a set of measurements, decide which basis to use for the next set of measurements, and start those measurements. The speed at which the classical control system can run this loop, and work through the measurements, determines the speed of the quantum computation. The characteristic time taken for the classical control system to react to a measurement and perform a following dependent measurement is referred as the control system's "reaction time". A quantum computation whose speed is limited by the measurement depth of the circuit and the reaction time of the classical control system is referred to as a "reaction limited computation".

This specification describes techniques for decreasing the space overhead of reaction limited computations and improving qubit routing in reaction limited computations. The techniques include: an optimized reaction limited selective CZ operation, referred to herein as a delayed choice CZ, techniques for producing and consuming AutoCCZ states, which make routing easier because they decouple the consumption of the CCZ state from the fixup operations needed to complete a gate teleportation, an improved CCZ distillation factory, and apparatus for performing addition operations and lookup operations.

Example Hardware

Figure 1:
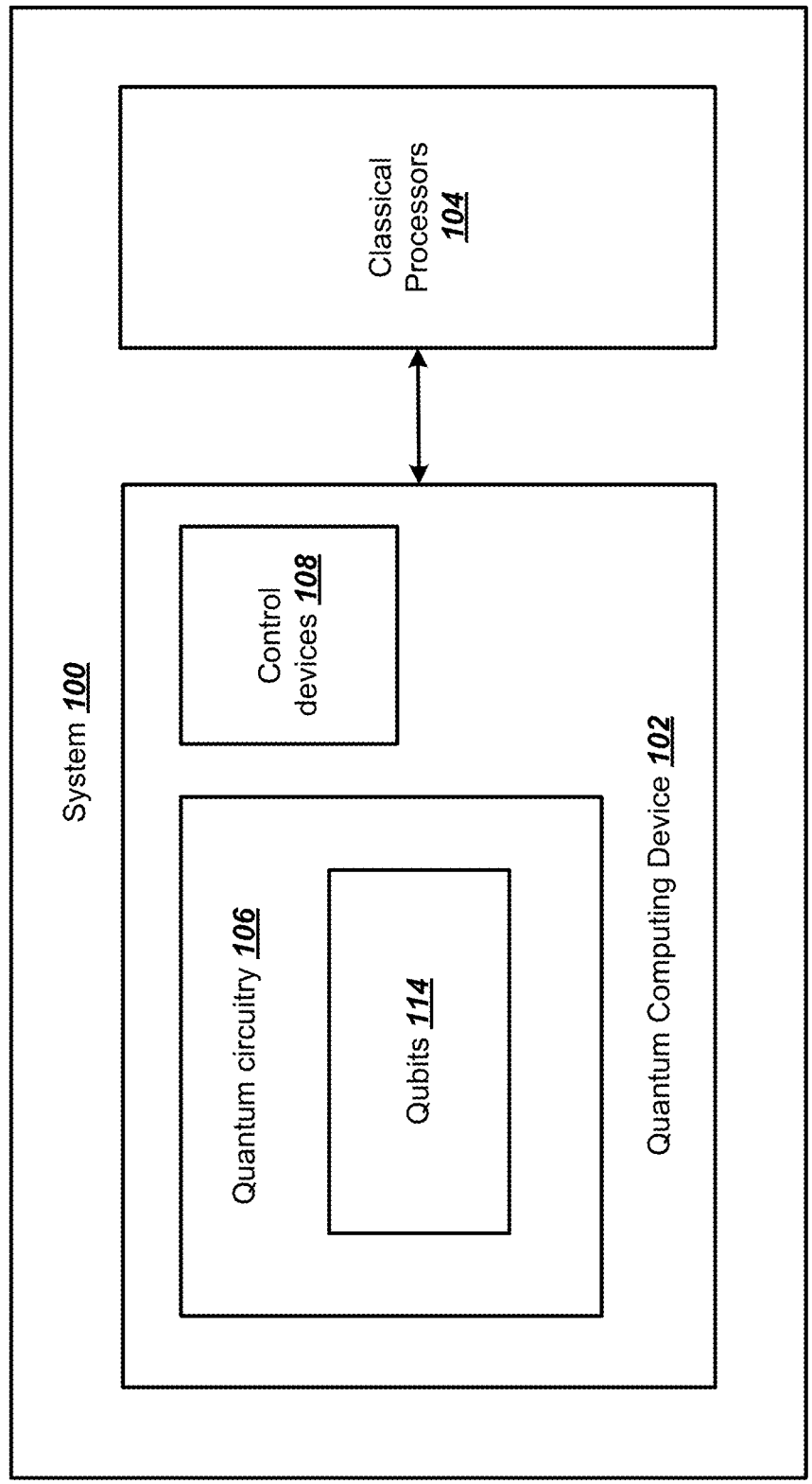
FIG. 1 shows an example quantum computation system.

FIG. 1 depicts an example quantum computation system 100. The system 100 is an example of a system implemented as quantum and classical computer programs on one or more quantum computing devices and classical computers in one or more locations, in which the systems, components, and techniques described below can be implemented.

The system 100 includes a quantum computing device 102 in data communication with one or more classical processors 104. For convenience, the quantum computing device 102 and classical processors 104 are illustrated as separate entities, however in some implementations the classical processors 104 may be included in the quantum computing device 102.

The quantum computing device 102 includes components for performing quantum computation. For example, the quantum computing device 102 includes quantum circuitry 106 and control devices 108.

The quantum circuitry 106 includes components for performing quantum computations, e.g., components for implementing the various quantum circuits and operations described in this specification. For example, the quantum circuitry may include a quantum system that includes one or more multi-level quantum subsystems, e.g., qubits 114. The qubits 114 are physical qubits that may be used to perform algorithmic operations or quantum computations. The specific realization of the one or more qubits and their interactions may depend on a variety of factors including the type of quantum computations that the quantum computing device 102 is performing. For example, the qubits may include qubits that are realized via atomic, molecular or solid-state quantum systems. In other examples the qubits may include, but are not limited to, superconducting qubits, e.g., Gmon or Xmon qubits, or semi-conducting qubits. Further examples of realizations of multi-level quantum subsystems include fluxmon qubits, silicon quantum dots or phosphorus impurity qubits. In some cases to the quantum circuitry may further include one or more resonators attached to one or more superconducting qubits. In some cases ion traps, photonic devices or superconducting cavities (with which states may be prepared without requiring qubits) may be used.

In this specification, the term "quantum circuit" is used to refer to a sequence of quantum logic operations that can be applied to a qubit register to perform a respective computation. Quantum circuits comprising different quantum logic operations, e.g., single qubit gates, multi-qubit gates, etc., may be constructed using the quantum circuitry 106. Constructed quantum circuits can be operated/implemented using the control devices 108.

The type of control devices 108 included in the quantum system depend on the type of qubits included in the quantum computing device. For example, in some cases the multiple qubits can be frequency tunable. That is, each qubit may have associated operating frequencies that can be adjusted using one or more control devices. Example operating frequencies include qubit idling frequencies, qubit interaction frequencies, and qubit readout frequencies. Different frequencies correspond to different operations that the qubit can perform. For example, setting the operating frequency to a corresponding idling frequency may put the qubit into a state where it does not strongly interact with other qubits, and where it may be used to perform single-qubit gates. In these examples the control devices 108 may include devices that control the frequencies of qubits included in the quantum circuitry 106, an excitation pulse generator and control lines that couple the qubits to the excitation pulse generator. The control devices may then cause the frequency of each qubit to be adjusted towards or away from a quantum gate frequency of an excitation pulse on a corresponding control driveline.

The control devices 108 may further include measurement devices, e.g., readout resonators. Measurement results obtained via measurement devices may be provided to the classical processors 104 for processing and analyzing. Measurement devices perform physical measurements on properties of the qubits, either directly or indirectly, from which the state(s) of the qubits can be inferred. Measurement devices perform physical measurements on properties of the qubits, either directly or indirectly, from which the state(s) of the qubits can be inferred.

The quantum computing device 102 can further include one or more quantum state factories, e.g., T factories, that produce and store quantum states, e.g., T or CCZ states, to be used in computations performed by the system 100.

Programming the Hardware: An Example Process for Implementing Delayed Choice CZ Operations Known techniques for performing delayed choice CZ operations are often not optimal. For example, teleporting a CCZ gate produces up to three possible CZ fixup operations. Using known techniques based on controllable multiplexers and de-multiplexers to delay the choice of whether or not the various CZ fixups should be applied would produce eight routing qubits per potential CZ (because there are two qubits involved in a CZ and each must go through a multiplexer/de-multiplexer pair). The presently described techniques is more compact and may only use two routing qubits.

Figure 2:
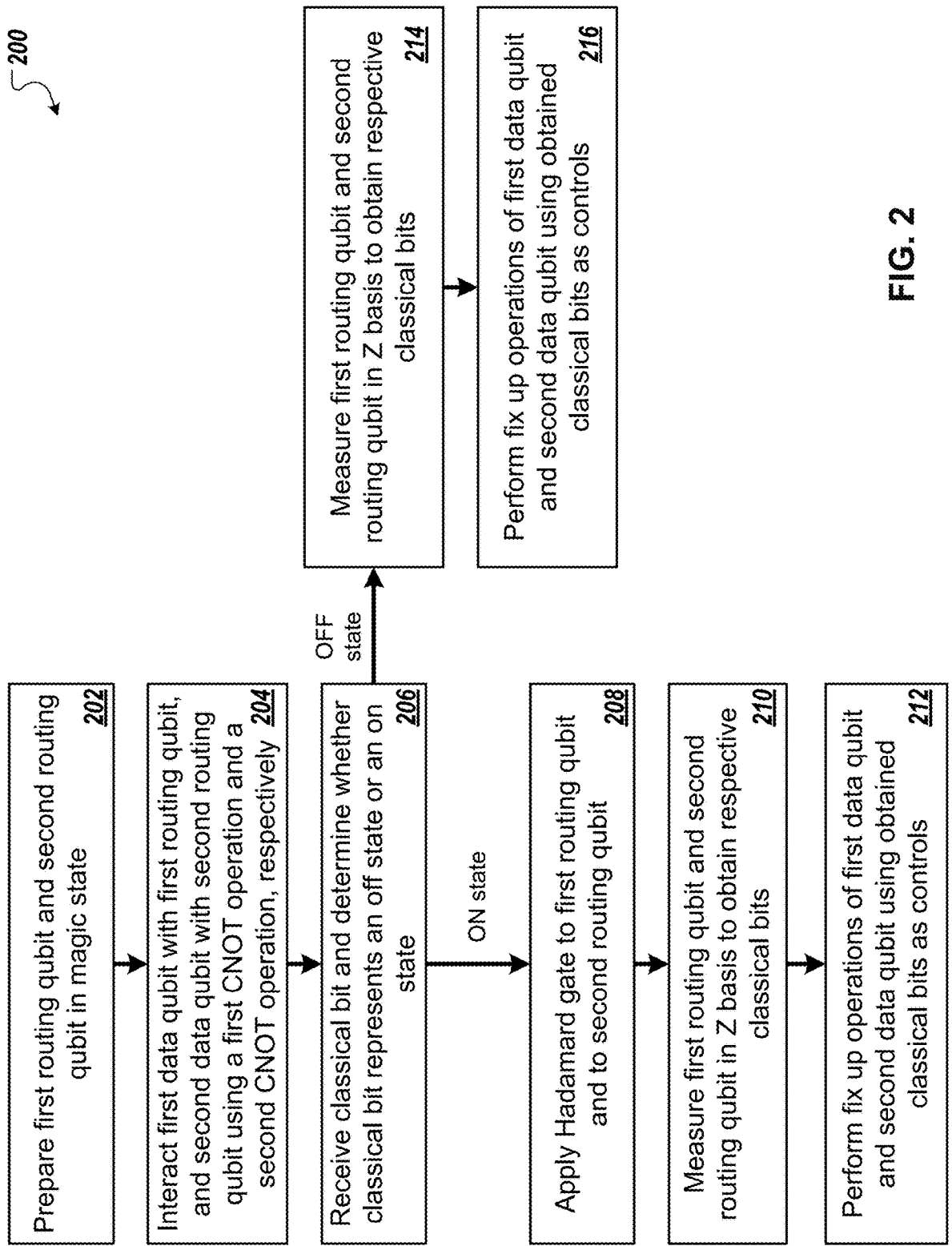
FIG. 2 is a flow diagram of an example process for performing a delayed choice CZ operation on a first data qubit and a second data qubit.

FIG. 2 is a flow diagram of an example process 200 for performing a delayed choice CZ operation on a first data qubit and a second data qubit. For convenience, the process 200 will be described as being performed by a system of one or more classical and quantum computing devices located in one or more locations. For example, a quantum computation system, e.g., the system 100 of FIG. 1, appropriately programmed in accordance with this specification, can perform the process 200.

The system prepares a first routing qubit and a second routing qubit in a magic state (step 202). For example, the system may prepare the first routing qubit in a plus state, prepare the second routing qubit in a plus state, and perform a CZ operation on the first routing qubit and the second routing qubit.

The system interacts i) the first data qubit with the first routing qubit, and ii) the second data qubit with the second routing qubit using a first CNOT operation and a second CNOT operation, respectively (step 204). The first data qubit and second data qubit act as a first control and a second control for the first CNOT operation and the second CNOT operation, respectively. Optionally, the system stores the states of the first routing qubit and second routing qubit.

The system receives a first classical bit from a classical processor. In some implementations the first classical bit may be an output of a classical computation that determines whether or not a classical controlled Z operation is to be performed on the first data qubit and second data qubit. The system determines whether the first classical bit represents an off state or an on state (step 206). The system determines whether the first classical bit represents the off state or on state by determining whether the first classical bit is 0 (where the first classical bit represents an on state) or 1 (where the first classical bit represents an off state).

In response to determining that the first classical bit represents an on state at step 206, the system performs the below described steps 208-212. The system applies a first Hadamard gate to the first routing qubit and applies a second Hadamard gate to the second routing qubit (step 208).

The system measures the first routing qubit using a Z basis measurement to obtain a second classical bit and measures the second routing qubit using a Z basis measurement to obtain a third classical bit (step 210).

The system performs classically controlled fix up operations on the first data qubit and second data qubit using the second classical bit and the third classical bit (step 212). To perform the classically controlled fix up operations the system: applies a classically controlled swap operation to the second classical bit and third classical bit, where the first classical bit acts as a control for the classically controlled swap operation, applies a first classically controlled Z operation to the second data qubit, where the third classical bit acts as a control for the first classically controlled Z operation, and applies a second classically controlled Z operation to the first data qubit, where the second classical bit acts as a control for the second classically controlled Z operation.

In response to determining that the first classical bit represents an off state at step 206, the system performs the below described steps 214-218. The system measures the first routing qubit using a Z basis measurement to obtain a fourth classical bit (step 214). The system measures the second routing qubit using a Z basis measurement to obtain a fifth classical bit (step 214). The system performs classically controlled fix up operations on the first data qubit and second data qubit using the obtained fourth classical bit and fifth classical bit (step 216).

To perform the classically controlled fix up operations on the first data qubit and the second data qubit, the system: applies a classically controlled swap operation to the fourth classical bit and fifth classical bit, where the first classical bit acts as a control for the classically controlled swap operation, applies a first classically controlled Z operation to the second data qubit, where the fifth classical bit acts as a control for the first classically controlled Z operation, and applies a second classically controlled Z operation to the first data qubit, where the fourth classical bit acts as a control for the second classically controlled Z operation.

Figure 3:
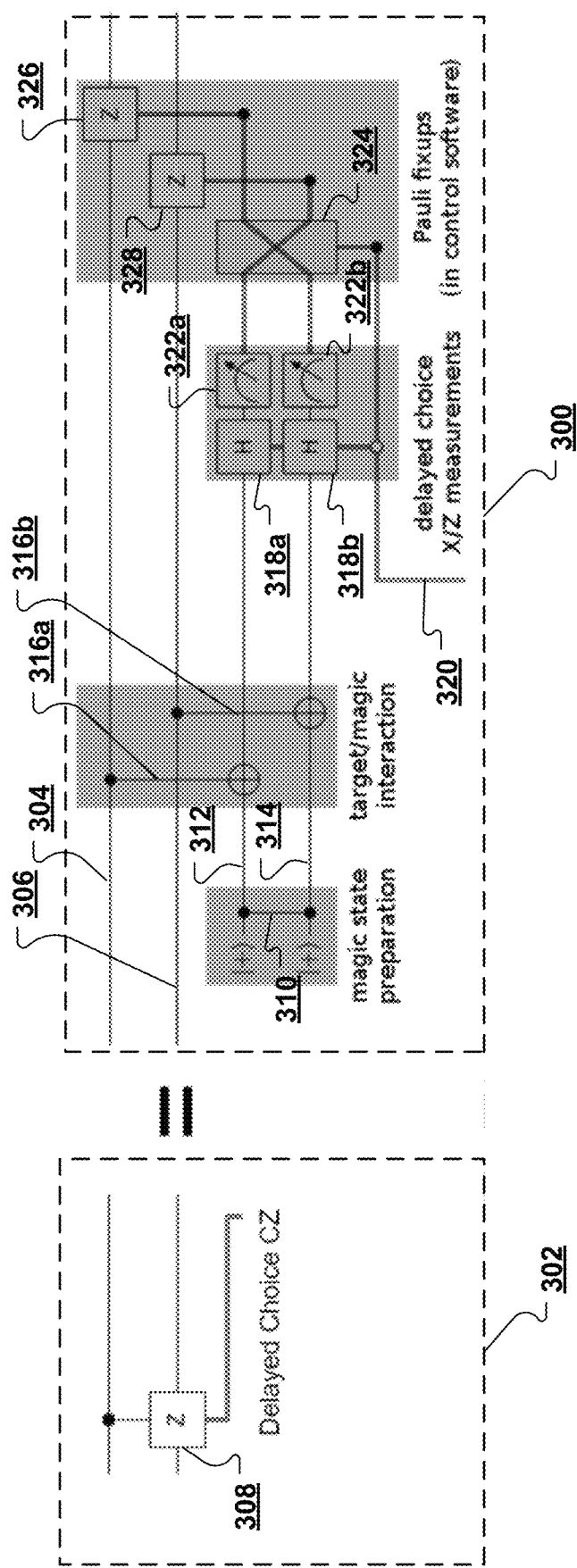
FIG. 3 is a circuit diagram of an example quantum circuit for performing a delayed choice CZ operation on a first data qubit and a second data qubit.

FIG. 3 is a circuit diagram of an example quantum circuit 300 for performing a delayed choice CZ operation 308 on a first data qubit 304 and a second data qubit 306, as shown in box 302. The example quantum circuit 300 includes a CZ operation 310 applied to a first routing qubit 312 and a second routing qubit 314, where both the first routing qubit 312 and the second routing qubit 314 are prepared in a plus state. Operation 310 corresponds to step 202 of example process 200.

The example quantum circuit 300 further includes a first CNOT operation 316a and a second CNOT operation 316b. The first CNOT operation 316a targets the first routing qubit and uses the first data qubit 304 as a control. The second CNOT operation 316b targets the second routing qubit and uses the second data qubit 306 as a control. Operations 316a, 316b correspond to step 204 of example process 200.

The example quantum circuit 300 further includes a first Hadamard gate 318a applied to the first routing qubit 312 and a second Hadamard gate 318b applied to the second routing qubit 314. Hadamard gates 318a and 318b are only applied when a classical bit 320 represents an on state (i.e., when the classical bit is a 0). Operations 318a, 318b correspond to steps 206-212 of example process 200.

The example quantum circuit 300 further includes a first measurement operation 322a applied to the first routing qubit 312 and a second measurement operation 322b applied to the second routing qubit 314. Operations 322a, 322b correspond to step 214 of example process 200.

The example quantum circuit 300 includes a classically controlled swap operation 324 that swaps the output of the measurement operations 322a, 322b if the classical bit 320 represents an on state (i.e., when the classical bit 320 is a 1). The example quantum circuit 300 further includes a first classically controlled Z gate 326 that is applied to the first data qubit 304 if an output of the classically controlled swap operation 324 corresponding to the first routing qubit represents an on state. The example quantum circuit 300 further includes a second classically controlled Z gate 328 that is applied to the second data qubit 306 if an output of the classically controlled swap operation 324 corresponding to the second routing qubit represents an on state. Operations 324-328 correspond to step 216 of example process 200.

Programming the Hardware: An Example Process for Implementing Auto Corrected CCZ Operations Three instances of the construction for performing delayed choice CZ operations as described in example process 200 of FIG. 2 can be embedded directly into a CCZ state, so that there is one delayed choice CZ for each CZ fixup that may be needed when performing gate teleportation. This augments the CCZ state into an "Auto-CCZ" state, so called because required fixup operations are automatically performed (through insertion of conditional Hadamard gates within the quantum circuit where remaining Pauli fixup operations can be performed within the control-software) and do not require conditional insertion of CZ gates based on measurement results. This makes consuming the state simpler, because no corrections are needed at the consumption site.

Figure 4:
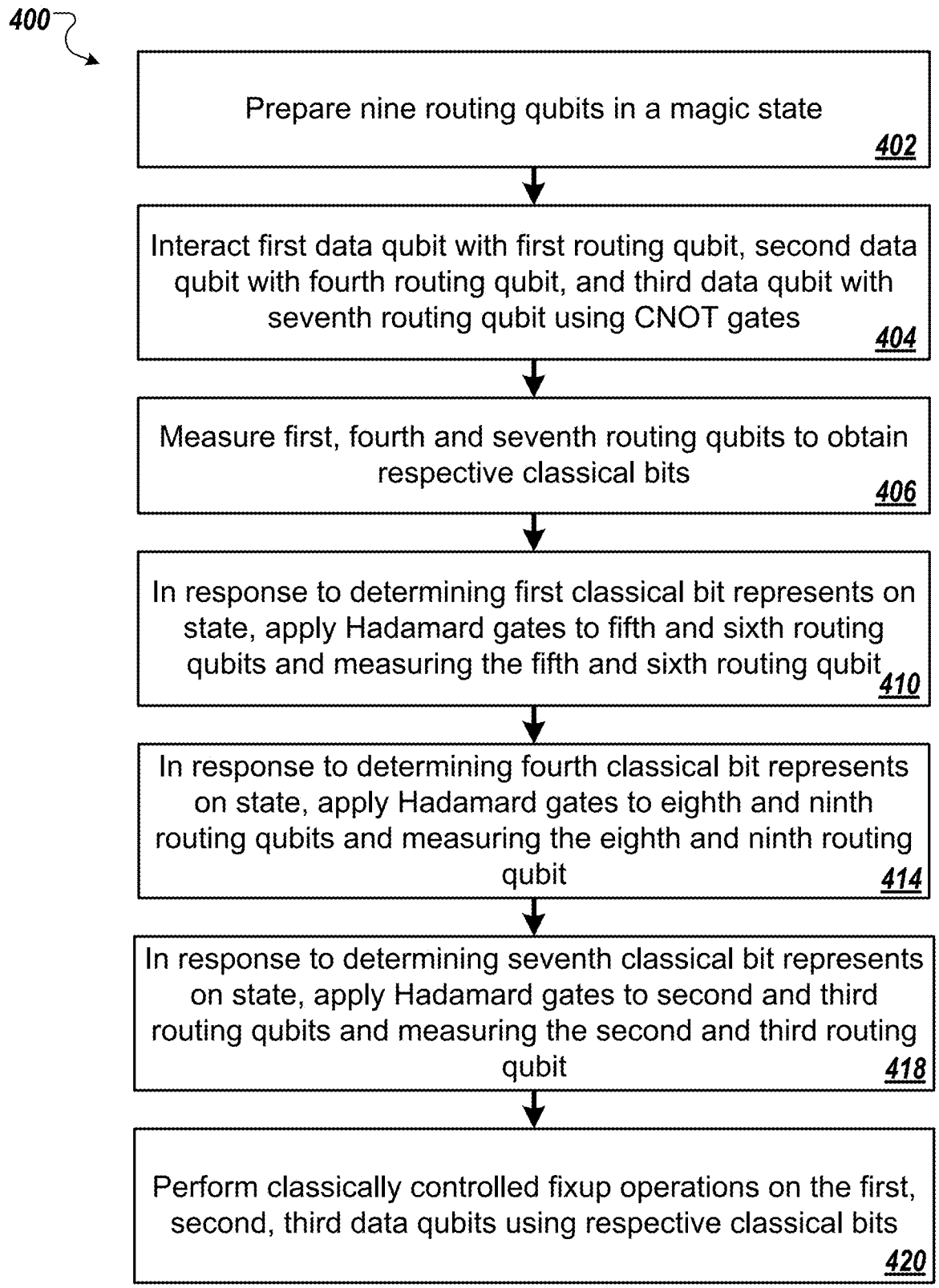
FIG. 4 is a flow diagram of an example process for performing an auto corrected CCZ operation on a first, second and third data qubit.

FIG. 4 is a flow diagram of an example process 400 for performing an auto corrected CCZ operation on a first, second and third data qubit. For convenience, the process 200 will be described as being performed by a system of one or more classical and quantum computing devices located in one or more locations. For example, a quantum computation system, e.g., the system 100 of FIG. 1, appropriately programmed in accordance with this specification, can perform the process 400.

The system prepares nine routing qubits in a magic state (step 402). For example, the system may prepare each of the nine routing qubits in a plus state, perform a CCZ operation on the first, fourth and seventh routing qubits, and perform CZ operations on pairs of neighboring routing qubits.

The system interacts i) the first data qubit with a first routing qubit using a first CNOT operation, ii) the second data qubit with a fourth routing qubit using a second CNOT operation, and iii) the third data qubit with a seventh routing qubit using a third CNOT operation (step 404). The first data qubit acts as a control for the first CNOT operation, the second data qubit acts as a control for the second CNOT operation, and the third data qubit acts as a control for the third CNOT operation.

The system measures the first, fourth and seventh routing qubits to obtain a first, fourth and seventh classical bit (step 406).

Optionally, the system stores the second routing qubit, third routing qubit, fifth routing qubit, sixth routing qubit, eighth routing qubit and ninth routing qubit.

The system determines whether the first classical bit represents an off state or an on state. In response to determining that the first classical bit represents an on state, the system applies a first Hadamard gate to the fifth routing qubit and applies a second Hadamard gate to the sixth routing qubit (step 408). The system measures the fifth routing qubit using a Z basis measurement to obtain a fifth classical bit and measures the sixth routing qubit using a Z basis measurement to obtain a sixth classical bit (step 410). In response to determining that the first classical bit represents an off state, the system does not perform the first Hadmard gate or second Hadamard gate and directly performs step 410.

The system determines whether the fourth classical bit represents an off state or an on state. In response to determining that the fourth classical bit represents an on state, the system applies a third Hadamard gate to the eighth routing qubit and applies a fourth Hadamard gate to the ninth routing qubit (step 412). The system measures the eighth routing qubit using a Z basis measurement to obtain a eighth classical bit and measures the ninth routing qubit using a Z basis measurement to obtain a ninth classical bit (step 414). In response to determining that the fourth classical bit represents an off state, the system does not apply the third and fourth Hadamard gates and directly performs step 414.

The system determines whether the seventh classical bit represents an off state or an on state. In response to determining that the seventh classical bit represents an on state, the system applies a fifth Hadamard gate to the second routing qubit and applies a sixth Hadamard gate to the third routing qubit (step 416). The system measures the second routing qubit using a Z basis measurement to obtain a second classical bit and measures the third routing qubit using a Z basis measurement to obtain a third classical bit (step 418). In response to determining that the seventh classical bit represents an off state, the system does not apply the fifth and sixth Hadamard gates and directly performs step 418.

The system performs classically controlled fix up operations on the first, second and third data qubits using respective classical bits (step 420). For example, the system may: apply a first classically controlled swap operation to the second classical bit and third classical bit, where the seventh classical bit acts as a control for the first classically controlled swap operation, apply a second classically controlled swap operation to the fifth classical bit and sixth classical bit, where the first classical bit acts as a control for the second classically controlled swap operation, apply a third classically controlled swap operation to the eighth classical bit and ninth classical bit, where the fourth classical bit acts as a control for the third classically controlled swap operation, apply multiple classically controlled Z operations to the first, second, and third data qubits, where each classically controlled Z operation uses one of the second, third, fifth, sixth, eighth or ninth classical bits as a control for the classically controlled Z operation, and apply multiple classically controlled-controlled Z operations to the first, second and third data qubits, where each classically controlled-controlled Z operation uses two of the first, fourth and seventh classical bits as controls for the classically controlled-controlled Z operation.

Applying multiple classically controlled Z operations to the first, second, and third data qubits, wherein each classically controlled Z operation uses one of the second, third, fifth, sixth, eighth or ninth classical bits as a control for the classically controlled Z operation, can include: applying a first classically controlled Z operation to the third data qubit, wherein the second classical bit acts as a control for the first classically controlled Z operation; applying a second classically controlled Z operation to the second data qubit, wherein the third classical bit acts as a control for the second classically controlled Z operation; applying a third classically controlled Z operation to the third data qubit, wherein the fifth classical bit acts as the control for the third classically controlled Z operation; applying a fourth classically controlled Z operation to the first data qubit, wherein the sixth classical bit acts as the control for the fourth classically controlled Z operation; applying a fifth classically controlled Z operation to the second data qubit, wherein the eighth classical bit acts as the control for the fifth classically controlled Z operation; and applying a sixth classically controlled Z operation to the first data qubit, wherein the ninth classical bit acts as the control for the sixth classically controlled Z operation.

Applying multiple classically controlled-controlled Z operations to the first, second and third data qubits, wherein each classically controlled-controlled Z operation uses two of the first, fourth and seventh classical bits as controls for the classically controlled-controlled Z operation, can include: applying a first classically controlled-controlled Z operation to the first data qubit, wherein the first classical bit and fourth classical bit act as controls for the first classically controlled-controlled Z operation; applying a second classically controlled-controlled Z operation to the second data qubit, wherein the fourth classical bit and seventh classical bit act as controls for the second classically controlled-controlled Z operation; and applying a third classically controlled-controlled Z operation to the third data qubit, wherein the first classical bit and seventh classical bit act as controls for the third classically controlled-controlled Z operation.

Figure 5:
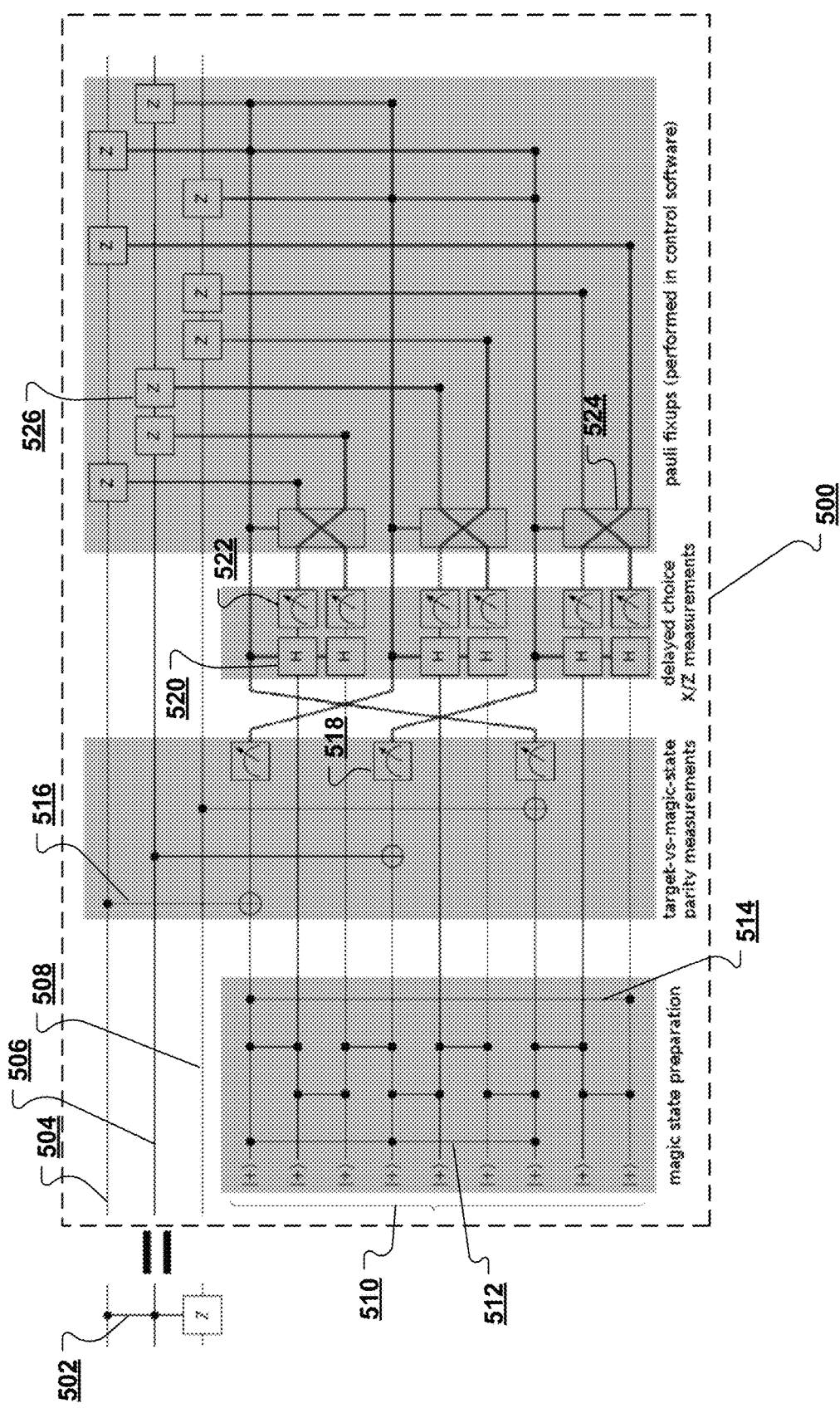
FIG. 5 is a circuit diagram of an example quantum circuit for performing an auto corrected CCZ operation on a first data qubit, second data qubit and a third data qubit.

FIG. 5 is a circuit diagram of an example quantum circuit 500 for performing an auto corrected CCZ operation 502 on a first data qubit 504, second data qubit 506 and a third data qubit 508. The example quantum circuit 500 includes a CCZ operation 512 applied to a first, fourth and seventh routing qubit in a register 510 that includes nine routing qubits, where each routing qubit is prepared in a plus state. The example quantum circuit 500 further includes multiple CZ operations, e.g., CZ operation 514, applied to pairs of neighboring routing qubits (with the convention that the last routing qubit neighbors the first routing qubit). For example, the example quantum circuit 300 includes a first CZ operation applied to the first and second routing qubits, a second CZ operation applied to the second and third routing qubits, etc. In total the example quantum circuit 500 includes nine CZ operations. The CCZ operation 512 and multiple CZ operation, e.g., CZ operation 514, correspond to step 402 of example process 400.

The example quantum circuit 500 includes three CNOT operations, e.g., CNOT operation 516. A first CNOT operation targets the first routing qubit and uses the first data qubit as a control. A second CNOT operation targets the fourth routing qubit and uses the second data qubit as a control. A third CNOT operation targets the seventh routing qubit and uses the third data qubit as a control. The three CNOT operations correspond to step 404 of example process 400.

The example quantum circuit 500 includes three measurement operations, e.g., measurement operation 518. A first measurement operation measures the first routing qubit. A second measurement operation measures the fourth routing qubit. A third measurement operation measures the seventh routing qubit. The three measurement operations correspond to step 406 of example process 400.

The example quantum circuit 500 includes multiple Hadamard gates, e.g., Hadamard gate 520. A first Hadamard gate and a second Hadamard gate are applied to the second routing qubit and third routing qubit, respectively, if a measurement result of the measurement operation performed on the seventh routing qubit represents an on state. A third Hadamard gate and a fourth Hadamard gate are applied to the fifth routing qubit and sixth routing qubit, respectively, if a measurement result of the measurement operation performed on the first routing qubit represents an on state. A fifth Hadamard gate and a sixth Hadamard gate are applied to the eighth routing qubit and ninth routing qubit, respectively, if a measurement result of the measurement operation performed on the fourth routing qubit represents an on state. The example quantum circuit 500 includes multiple measurement operations, e.g., measurement operation 522, that are applied to the second, third, fifth, sixth, eighth and ninth routing qubits. The Hadamard gates and measurement operations described correspond to steps 410-426 of example process 400.

The example quantum circuit 500 includes multiple classically controlled swap operations, e.g., classically controlled swap operation 524, that swap outputs of respective measurement operations if a respective classical bit represents an on state. For example, classically controlled swap operation 524 swaps the outputs of the measurement operations performed on the eighth and ninth routing qubits if the output of the measurement operation performed on the fourth routing qubit represents an on state. A second classically controlled swap operation swaps the outputs of the measurement operations performed on the fifth and sixth routing qubits if the output of the measurement operation performed on the first routing qubit represents an on state. A third classically controlled swap operation swaps the outputs of the measurement operations performed on the second and third routing qubits if the output of the measurement operation performed on the seventh routing qubit represents an on state. The classically control swap operations described correspond to step 428 of example process 400.

The example quantum circuit 500 includes multiple classically controlled Z gates, e.g., classically controlled Z gate 526, that are applied to the first data qubit 504, second data qubit 506 and third data qubit 508 based on outputs of the three classically controlled swap operations. For example, a first Z gate is applied to the first data qubit 504 if an output of the third classically controlled swap operation corresponding to the second routing qubit represents an on state. A second Z gate is applied to the second data qubit 506 if an output of the third classically controlled swap operation corresponding to the third routing qubit represents an on state. A third Z gate 526 is applied to the second data qubit 506 if an output of the second classically controlled swap operation corresponding to the fifth routing qubit represents an on state. A fourth Z gate is applied to the third data qubit 508 if an output of the second classically controlled swap operation corresponding to the sixth routing qubit represents an on state. A fifth Z gate is applied to the third data qubit 508 if an output of the first classically controlled swap operation 524 corresponding to the eighth routing qubit represents an on state. A sixth Z gate is applied to the first data qubit 504 if an output of the first classically controlled swap operation 524 corresponding to the ninth routing qubit represents an on state.

A seventh Z gate is applied to the third data qubit if the output of the measurement of the first routing qubit and the fourth routing qubit both represent on states. An eighth Z gate is applied to the first data qubit if the output of the measurement of the seventh routing qubit and the fourth routing qubit both represent on states. A ninth Z gate is applied to the second data qubit if the output of the measurement of the first routing qubit and the seventh routing qubit both represent on states. The multiple classically controlled Z gates correspond to step 428 of example process 400.

Programming the Hardware: An Example Process for CCZ Quantum State Distillation

Operations that are not native to the surface code can be performed using magic state distillation and gate teleportation. A particularly useful magic state is the CCZ state $$|CCZ\rangle = CCZ|+\rangle^{\otimes 3} = \sum_{a,b,c \in \{0,1\}} (-1)^{abc} |abc\rangle$$

This quantum state is particularly useful because the quantum equivalent of the AND gate—the Toffoli gate—is not native to the surface code but can be performed by consuming one CCZ state. Algorithms with a lot of arithmetic, such as Grover's algorithm and Shor's algorithm, perform many Toffoli gates and benefit from using a state specialized to this task.

Figure 6:
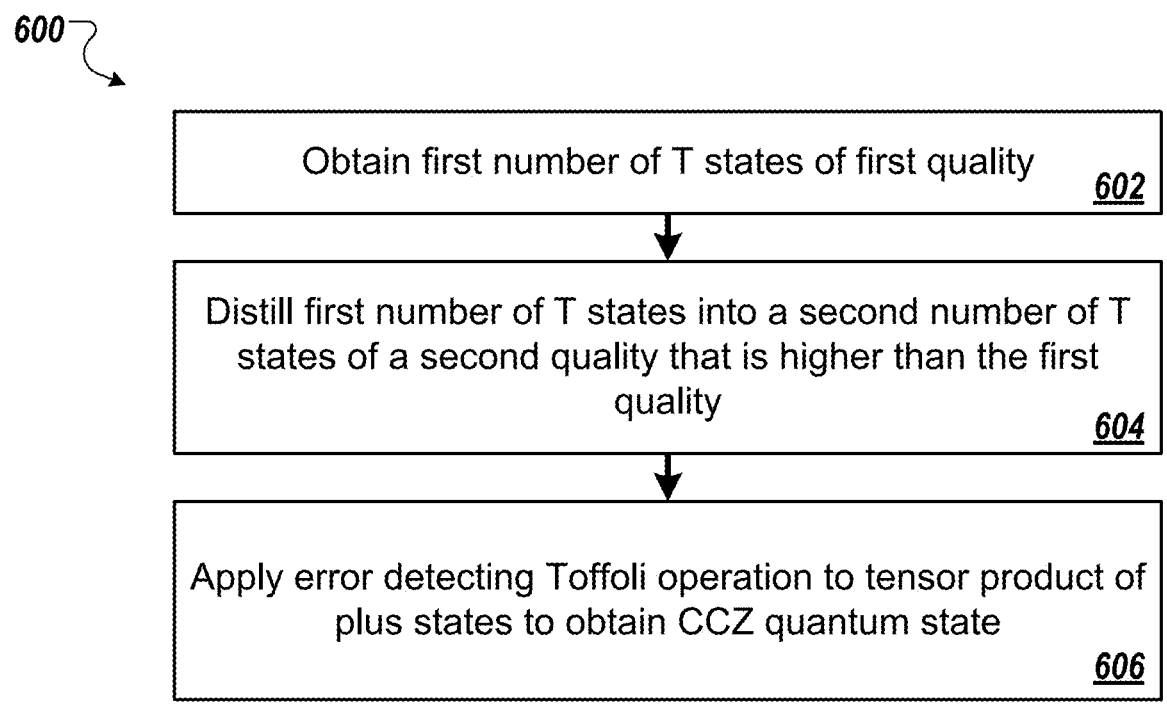
FIG. 6 is a flow diagram of an example process for producing a CCZ quantum state

FIG. 6 is a flow diagram of an example process 600 for producing a CCZ quantum state. For convenience, the process 600 will be described as being performed by a system of one or more classical and quantum computing devices located in one or more locations. For example, a quantum computation system, e.g., the system 100 of FIG. 1, appropriately programmed in accordance with this specification, can perform the process 600.

The system obtains a first number of T states of a first quality (step 602). The system can obtain the first number of T states from a level-0 T state factory. In some implementations the system can perform state injection techniques to obtain the first number of T states.

The system distills the first number of T states of the first quality into a second number of T states of a second quality (step 604). The second number is smaller than the first number and the second quality is higher than the first quality. For example, in some implementations the system can implement the Reed-Muller code to distill the first number of T states into the second number of T states. The first number of T states can include at least 15×8 T states and the second number of T states can include 8 T states. The system can distill the first number of T states into a second number of T states using a level-1 T state factory.

In some implementations the system distills the first number of T states of the first quality into a second number of T states of a second quality using multiple T factories, where each T factory receives the first number of T states of the first quality at least partially in parallel with stabilizer measurements performed by the T factory.

The system applies, using the second number of T states of the second quality, an error detecting Toffoli operation to a tensor product of plus states to obtain the CCZ quantum state (step 606). The second number of T states can be provided for use in the error detecting operation at least partially in parallel with stabilizer measurements performed during the error detecting operation. The system can obtain the CCZ quantum state using a CCZ factory that includes six level-1 T factories. In some implementations the CCZ quantum state can be obtained using a CCZ factory of depth $5d$, where d represents error correcting code distance.

In some implementations the system chooses error correcting code distances for factories producing the first number of T states, second number of T states and CCZ state based on a target error rate and not based on layout considerations. For example, the probability of logical error in a single layer of surface code circuitry covering d×d data qubits with a characteristic physical gate error rate p is approximately $p_L = 0.1(100p)^{((d+1)/2)}$. A typical state distillation structure can involve on the order of 1000 of such patches. If the target probability of logical failure from the distillation structure is no more than $10^{-11}$, this would set a minimum code distance via $10^{-11} > 1000 * 0.1(100p)(d+1/2)$. If p=0.001, which is a typical target physical gate error rate, this would reduce to $10^{-11} > 100 * 0.1(d+1/2)$ implying a minimum code distance of 27.

The production rate of the CCZ factory can be limited by either the level 1 or level 2 distances. At level 2 the production rate of the factory is limited by the factory's depth times the cycle time times the level 2 code distance. So, under the assumption of: a reaction time of 10 microseconds, a cycle time of 1 microsecond, a level 1 code distance of 17 and a level 2 code distance of 27, the level 2 part of the factory is technically capable of producing states at a rate of $(5.1 \text{ μs } 27)^{-1}$ 7.4 kHz. The level 1 part of the factory needs to produce 8 level 1 T states for each CCZ state that will be output. There are six level 1 T factories, and they have a depth of $5.75d_1$, which means the output rate of the entire factory cannot be larger than $(5.75 \cdot 17 \cdot 1 \text{ μs } 8/6)^{-1}$ 7.7 kHz. Therefore the level 2 code distance is the limiting factor, and the factory runs at 7.4 kHz.

In a reaction limited computation, one CCZ state will be needed per reaction time of the classical control system. That is to say, CCZ states are consumed at a rate of 100 kHz. Therefore, given the above assumptions, a reaction limited computation may require [100/7.4]=14 CCZ factories running in parallel.

Example Hardware Layout: Improved System Layout for Performing Reaction Limited Addition Operations The above described Auto-CCZ states can be used to construct an improved system layout for performing reaction limited addition operations, e.g., implementing a quantum ripple-carry addition circuit as described in "A new quantum ripple-carry addition circuit," Cuccaro et. al., arXiv preprint quant-ph/0410184, 2004, the disclosure of which is incorporated herein by reference in its entirety. These quantum ripple-carry addition circuits compute the sum of two n-bit numbers $a = a_0 a_1 \ldots a_{n-1}$ and $b = b_0 b_1 \ldots b_{n-1}$ where $a_0$, $b_0$ represent the lowest order bits. $A_i$, $B_i$ represent memory locations where $a_i$, $b_i$ are initially stored respectively. The numbers a and b are added in place, and at the end $B_i$ contains $s_i$, the i-th bit of the sum, replacing $b_i$. There is one additional output location for the high bit $s_n$. The carry string for the addition can be defined recursively—$c_0 = 0$ and $c_{i+1} = \text{MAJ}(a_i, b_i, c_i)$ for $i \geq 1$ where MAJ represents an "in place Majority" operation defined by $\text{MAJ}(a_i, b_i, c_i) = a_i b_i \oplus a_i c_i \oplus b_i c_i$ such that $c_i = a_i \oplus b_i \oplus c_i$ for all i<n and $s_n = c_n$. Each c i can be computed in order, from $c_1$ to $c_n$. To perform an addition of two n-bit numbers a sequence of n MAJ gates is performed. After performing the ladder of MAJ gates a sequence of "UnMajority and Add" (UMA) gates is performed, proceeding in reverse order. Each UMA gate uncomputes a corresponding MAJ gate and performs a three-way $Z_2$ addition $a_i \oplus b_i \oplus c_i$.

The system layout enables some operations of the addition circuit to be laid out in a space-like fashion, so that they can be performed approximately simultaneously (e.g., within limits of the available hardware). This is achieved by implementations of the addition circuit's in-place majority MAJ operations and UnMajority and Add UMA operations that accept CCZ states and propagate involved bits horizontally across space, instead of vertically through time. The entire addition circuit is not laid out in a spacelike fashion, since this would require a number of CCZ factories that is proportional to the size of the addition instead of proportional to the reaction time of the control system. Instead, the addition is performed back and forth across space, performing an amount of carry rippling that keeps the CCZ factories and corresponding classical control system operating at a system-specific optimal rate.

The system layout also enables CCZ states produced by CCZ factories to be efficiently routed into the addition operation. Each "in-place majority" operation has four inputs and three outputs. One of the inputs, and also one of the outputs, is a carry qubit. Another two of the inputs (and outputs) are data qubits—one from the target register and one from the offset register. The remaining input is the three qubits making up the CCZ part of an Auto-CCZ state. These input and output qubits must be routed in a way that causes them to intersect the "in-place majority" operation at the right place and at the right time. The presently described system layout achieves this by moving the carry qubit back and forth along the X axis (right/left through space), while running data qubits through along the Y axis (forward/back through space). CCZ factories are placed in front of and behind the area in which the carry qubit is moved back and forth (referred to herein an operating area), so that their outputs are produced directly adjacent to where they are needed making routing trivial. Gaps are left between adjacent factories, so that data qubits from outside the operating area can be routed through those gaps as needed.

As more and more data qubits are routed from behind the operating area to in front (or vice versa), the operating area is shifted backward (or forward). The two data registers are interleaved into alternating rows, so that qubits that need to reach the same "in-place majority" operation at the same time are adjacent. Within each row there is additional interleaving, spacing out qubits that are sequential in the register. This prevents congestion as the data qubits are routed through the gaps between the factories.

Figure 7:
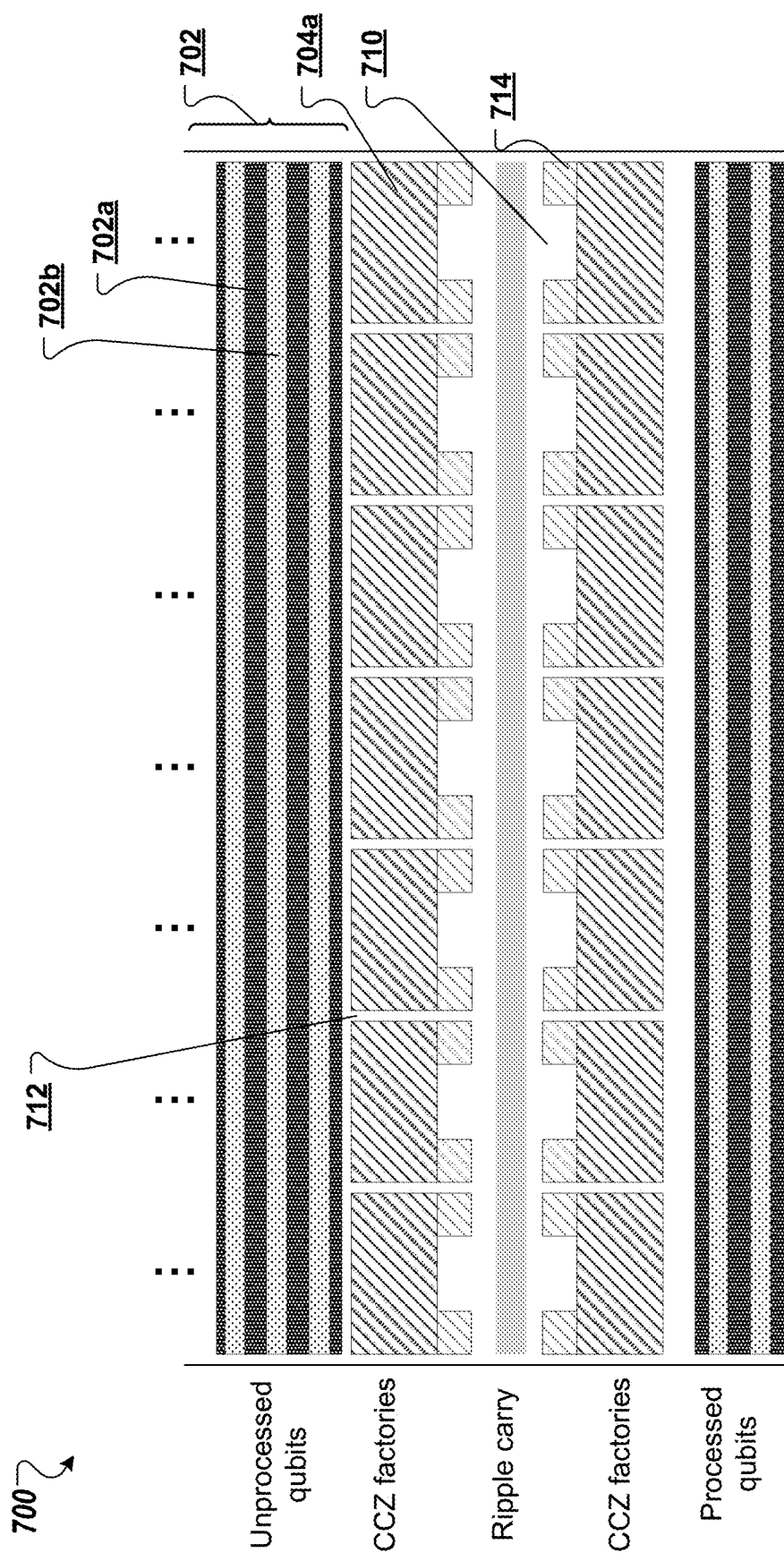
FIG. 7 shows an example system layout for performing a reaction limited ripple-carry addition operation.

FIG. 7 shows an example system layout 700 for performing a reaction limited ripple-carry addition operation. The example system layout 700 is shown from above. That is, the horizontal axis and vertical axis are spatial axes. For example, the example system layout 700 can be part of a quantum chip or tiled array of chips. In the example system layout 700, a level 2 code distance of 27 and a level 1 code distance of 17 are assumed.

The example system includes multiple qubits. The multiple qubits are arranged in the example system layout 700 in a two dimensional array that includes multiple rows 702, where each row includes multiple qubits, e.g., 113 logical qubits. The multiple qubits include qubits from a lookup output register, e.g., qubits in row 702a, and from a target register, e.g., qubits in row 702b. Rows of qubits from the lookup output register and rows of qubits from the target register are interleaved to allow qubits in each register to be operated on pairwise, as described above.

Each row is associated with a value at a respective position in a sequence of n bits, where the sequence of bits represents a binary numeric value. The top row of qubits in the multiple rows is associated with a value representing a most significant bit in the sequence of n bits, and increasingly lower rows of qubits in the multiple rows are associated with respective values representing decreasing significant bits in the sequence of n bits.

Rows of qubits from the target register represent the n-bit numbers that are to be added, where alternate qubits in each row of qubits from the target register represent the respective numbers to be added. For example, when adding the number 123123123123 to 456456456456 (which for illustrative purposes only are given in decimals, not binary), the target register may store 142536142536142536142536. If the two-dimensional array of qubits has length 6 (e.g., the rows 702 include 6 qubits) then the rows 702 would include four rows of qubits from the target register:
142536
142536
142536
142536
(where interleaving rows of qubits from the lookup register are not included in the example).

The example system layer 700 further includes multiple CCZ factories 704, e.g., CCZ factory 704a, that produce the presently described Auto-CCZ states and provide produced states for use in the addition operation performed in the operating area 710, e.g., for use in "in-place majority" operations. Each CCZ factory includes two CCZ fixup areas, e.g., area 714, because routing qubits emerging from a CCZ fixup box can extend vertically into a next layer before the control system determines how to measure the routing qubits.

In the example system layout 700, the multiple CCZ factories 704 surround an operating area 710. The operating area 710 is an area in which the multiple rows of qubits are operated on to perform the addition operation. The CCZ factories 704 are separated in space by gaps, e.g., gap 712, to allow qubits to be routed into and through the operating area 710, as described above.

During an addition operation, for each row of qubits in the multiple rows and starting with a row of qubits at the bottom of the multiple rows: qubits in the row are moved through one or more of the gaps and into the operating area where an addition operation is performed using the qubits in the row, and after the addition operation is performed, the qubits in the row are moved through and out of the operating area. For example, continuing the example given above where 456456456456 is to be added to 123123123123 and the target register initially stores the number 142536142536142536142536 in four rows of six qubits:
142536
142536
142536
142536
the addition operation proceeds by adding the lower right 3+6 and storing the result in qubits below the operating area 710 and the lower row of CCZ factories. Since one number is added to the other at each respective position, in this example and after processing an entire row, the state of the machine could be:
142536
142536
142536
CCZ Factories
Operating area
CCZ Factories
547596
The addition continues scanning across each row of target qubits.

The output of the ripple carry operation can be obtained by measuring the qubits that have been moved through and out of the operating area.

The example system layout 700 can perform ripple-carry addition operations at the reaction limited rate, propagating carry information from qubit to qubit at 100 kHz. Under reasonable physical assumptions, it is estimated that the layout would add a pair of thousand-qubit registers in approximately 20 milliseconds.

Example Hardware Layout: Improved System Layout for Performing Table Lookup Operations The above described ripple-carry addition operation is ideal for reaction limited computation because it has only a small amount of Clifford operations per Toffoli operation. A table lookup operation (also called a QROM read) is different—for each Toffoli operation performed in a table lookup, there multiple Clifford operations to perform. In particular, each Toffoli triggers a large multi-target CNOT operation that potentially involves all lookup output qubits. Because of this, the limiting factor during a table lookup is not the classical control system's reaction time but rather access to the output qubits.

In order to target a logical qubit with a CNOT, an unused logical-qubit sized patch of surface code adjacent to that logical qubit is needed. The CNOT operation will then use that patch for d cycles, where d is the code distance. For qubits where only one side is accessible, only one CNOT can be performed per d cycles. Under the assumption that a surface code cycle time equals 1 microsecond, and using a code distance of 27 (as an example), this suggests a maximum CNOT rate of 37 kHz (instead of the 100 kHz of a reaction limited computation).

It can be possible to work around this CNOT rate limitation. For example, if there are multiple single-control single-target CNOTs all targeting the same qubit, it is possible to fuse the many CNOTs into a single generalized CNOT where the control is a Pauli product of all the individual controls. However, this does not work in the case of table lookups because the set of relevant control qubits differs from output qubit to output qubit. Therefore, to overcome the CNOT rate limitation the presently described example system layout makes two sides of each qubit accessible, instead of just one. The large multi-target CNOT operations can then alternate between using one side, and using the other side. This doubles the achievable Toffoli rate from 37 kHz to 74 kHz, which is much closer to 100 kHz.

In addition, while performing the lookup, the example system layout includes a tiled row interleaving pattern of R_L_L_R where an L represents a lookup data row, R represents an existing data row not involved in the lookup, and an underscore represents an empty access row that can be used when performing the multi-target CNOTs. The multi-target CNOT operations alternate between using the single inner access row and both of the outer access rows. In order to access the access rows, cross-row access corridors are included on opposing sides of the layout. The multi-target CNOT operations can alternate between using the two access corridors, so that they can branch into individual access rows as needed.

Figure 8:
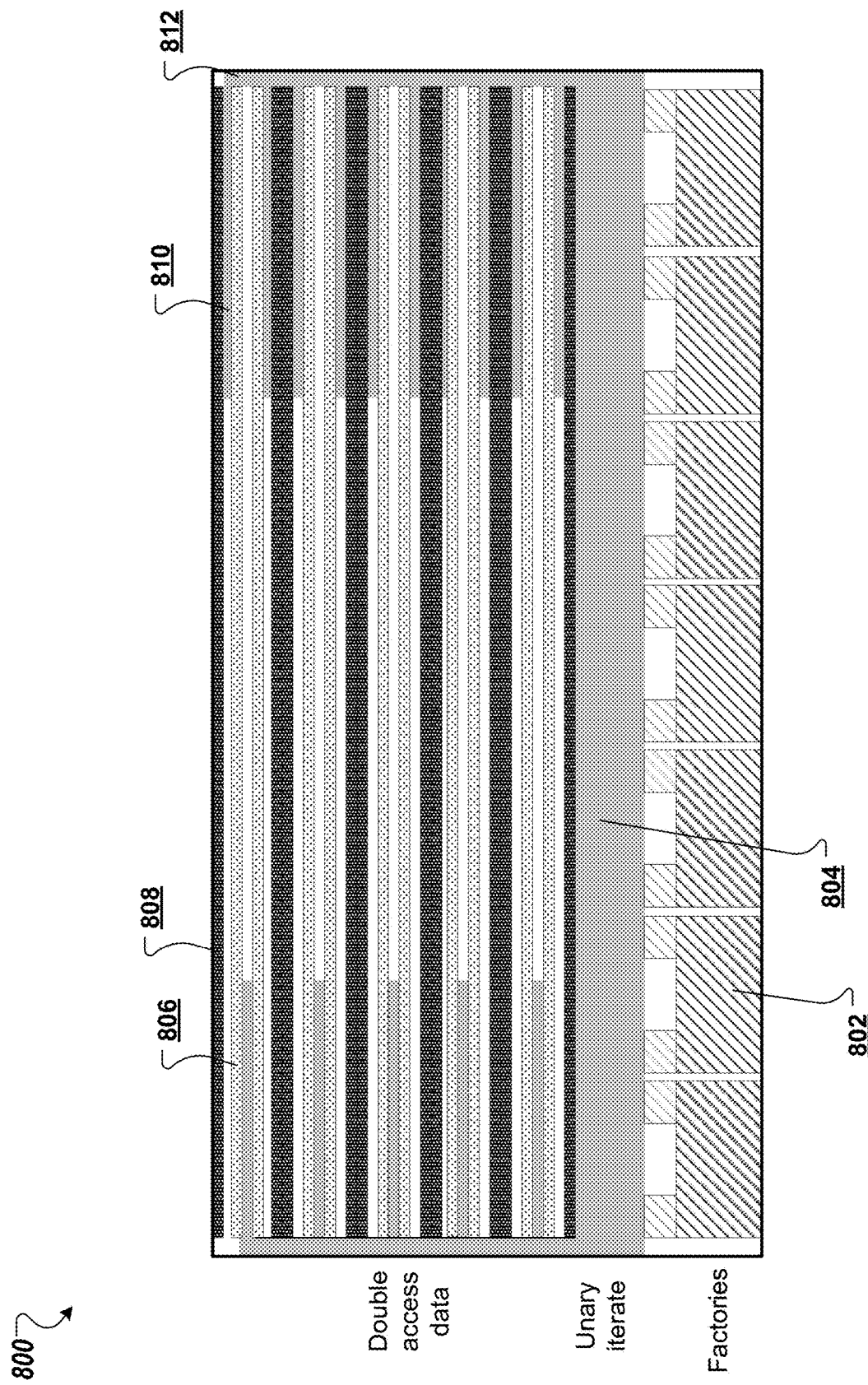
FIG. 8 shows an example system layout for performing a table lookup operation.

FIG. 8 shows an example system layout 800 for performing a table lookup operation. The example system layout 800 is shown from above. That is, the horizontal axis and vertical axis are spatial axes. For example, the example system layout 800 can be part of a quantum chip or tiled array of chips. In the example system layout 800, a level 2 code distance of 27 and a level 1 code distance of 17 are assumed.

The example system layout 800 includes multiple CCZ factories, e.g., CCZ factory 802, that feed the presently described auto-CCZ states into a first operating area 804 where the lookup operation is performed. Because the first operating area 804 is positioned centrally in the example system layout 800, it is referred to herein as a central operating area 804.

The example system includes a lookup output register that, in turn, includes multiple lookup output qubits. In the example system layout 800 the multiple lookup output qubits are arranged in a two-dimensional array that includes multiple rows, e.g., row 806, where each row is associated with a value at a respective position in a sequence of n bits that represents a binary numeric value. A top row of qubits in the two-dimensional array is associated with a value representing a most significant bit in the sequence of n bits, and increasingly lower rows of qubits are associated with respective values representing decreasing significant bits in the sequence of n bits. The example system further includes a target register of qubits that are also arranged in rows, e.g., row 808, that are interleaved between rows of lookup output qubits. The target register is idle during the lookup operation.

Each lookup output qubit is adjacent to one or more second operating areas, e.g., area 810, that are positioned between rows in the multiple rows and that extend from approximately a vertical center of the two-dimensional array of qubits to one of two sides of the array, e.g., side 812, and where third operating areas positioned at each side of the two-dimensional array connect the second operating areas to the first operating area 804. Because the second operating areas extend along the x axis, they are referred to herein as horizontal operating areas or horizontal access rows. Similarly, because the third operating areas extend along the y axis, they are referred to herein as vertical operating areas or vertical access corridors. The vertical access corridors and horizontal access rows provide two distinct ways to simultaneously access all output qubits when performing many-target CNOTs.

In some implementations the example system layout 800 further includes a factor register of qubits including a first number of qubits that are idle and a second number of qubits that are used as address bits in the lookup operation, where the factor register is adjacent to the CCZ factories and separate from the central operating area 804.

Implementations of the digital and/or quantum subject matter and the digital functional operations and quantum operations described in this specification and appendix can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators. Quantum computation systems in general and quantum computers specifically may be realized or based on different quantum computational models and architectures. For example, the quantum computation system may be based on or described by models such as the quantum circuit model, one-way quantum computation, adiabatic quantum computation, holonomic quantum computation, analog quantum computation, digital quantum computation, or topological quantum computation.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, multiple digital and quantum processors or computers, and combinations thereof. The apparatus can also be, or further include, special purpose logic circuitry, e.g., an FPGA (field programmable gate array), an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum processors or both, or any other kind of central digital and/or quantum processing unit. Generally, a central digital and/or quantum processing unit will receive instructions and digital and/or quantum data from a read-only memory, a random access memory, or quantum systems suitable for transmitting quantum data, e.g. photons, or combinations thereof.

Elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method for implementing a delayed choice CZ operation using a quantum computer, the method comprising:
   applying a first Hadamard gate to a first routing qubit and applying a second Hadamard gate to a second routing qubit, wherein the first routing qubit is prepared in a magic state and interacts with a first data qubit and the second routing qubit is prepared in a magic state and interacts with a second data qubit;
   measuring the first routing qubit using a Z basis measurement to obtain a second classical bit
   measuring the second routing qubit using a Z basis measurement to obtain a third classical bit; and
   performing classically controlled fix up operations on a first data qubit and a second data qubit using the second classical bit and the third classical bit.

2. The method of claim 1, wherein performing classically controlled fix up operations on the first data qubit and the second data qubit using the second classical bit and the third classical bit comprises:
   receiving a first classical bit that represents an off state;
   applying a classically controlled swap operation to the second classical bit and third classical bit, wherein the first classical bit acts as a control for the classically controlled swap operation; and
   applying a first classically controlled Z operation to the second data qubit, wherein the third classical bit acts as a control for the first classically controlled Z operation; and
   applying a second classically controlled Z operation to the first data qubit, wherein the second classical bit acts as a control for the second classically controlled Z operation.

3. The method of claim 1, further comprising preparing the first routing qubit and the second routing qubit in the magic state, comprising:
   preparing the first routing qubit in a plus state;
   preparing the second routing qubit in a plus state; and
   performing a CZ operation on the first routing qubit and the second routing qubit.

4. The method of claim 2, wherein the first classical bit comprises an output of a classical computation that determines whether or not a classical controlled Z operation is to be performed on the first data qubit and second data qubit.

5. A quantum computation system comprising:
   a plurality of data qubits;
   a plurality of routing qubits; and
   a plurality of control devices configured to operate the plurality of data qubits and the plurality of routing qubits;
   wherein the quantum computation system is configured to perform operations comprising:
      applying a first Hadamard gate to a first routing qubit and applying a second Hadamard gate to a second routing qubit, wherein the first routing qubit is prepared in a magic state and interacts with a first data qubit and the second routing qubit is prepared in a magic state and interacts with a second data qubit;
      measuring the first routing qubit using a Z basis measurement to obtain a second classical bit
      measuring the second routing qubit using a Z basis measurement to obtain a third classical bit; and
      performing classically controlled fix up operations on the first data qubit and second data qubit using the second classical bit and the third classical bit.

6. The quantum computation system of claim 5, wherein performing classically controlled fix up operations on the first data qubit and the second data qubit using the second classical bit and the third classical bit comprises:
   receiving a first classical bit that represents an off state;
   applying a classically controlled swap operation to the second classical bit and third classical bit, wherein the first classical bit acts as a control for the classically controlled swap operation; and applying a first classically controlled Z operation to the second data qubit, wherein the third classical bit acts as a control for the first classically controlled Z operation; and applying a second classically controlled Z operation to the first data qubit, wherein the second classical bit acts as a control for the second classically controlled Z operation.

7. The quantum computation system of claim 5, wherein the operations further comprise preparing the first routing qubit and the second routing qubit in the magic state, comprising:
preparing the first routing qubit in a plus state;
preparing the second routing qubit in a plus state; and performing a CZ operation on the first routing qubit and the second routing qubit.

8. The quantum computation system of claim 6, wherein the first classical bit comprises an output of a classical computation that determines whether or not a classical controlled Z operation is to be performed on the first data qubit and second data qubit.

9. A method for implementing an auto corrected CCZ operation on a first, second and third data qubit using a quantum computer, the method comprising:
measuring a fourth routing qubit to obtain a fourth classical bit that represents an on state, wherein the fourth routing qubit is prepared in a magic state and interacts with the second data qubit;
measuring a seventh routing qubit to obtain a seventh classical bit that represents an on state, wherein the seventh routing qubit is prepared in a magic state and interacts with the third data qubit;
applying a first Hadamard gate to a fifth routing qubit prepared in a magic state and applying a second Hadamard gate to a sixth routing qubit prepared in a magic state;
measuring the fifth routing qubit using a Z basis measurement to obtain a fifth classical bit and measuring the sixth routing qubit using a Z basis measurement to obtain a sixth classical bit;
applying a third Hadamard gate to an eighth routing qubit prepared in a magic state and applying a fourth Hadamard gate to a ninth routing qubit prepared in a magic state;
measuring the eighth routing qubit using a Z basis measurement to obtain an eighth classical bit and measuring the ninth routing qubit using a Z basis measurement to obtain a ninth classical bit;
applying a fifth Hadamard gate to a second routing qubit prepared in a magic state and applying a sixth Hadamard gate to a third routing qubit prepared in a magic state;
measuring the second routing qubit using a Z basis measurement to obtain a second classical bit and measuring the third routing qubit using a Z basis measurement to obtain a third classical bit; and
performing classically controlled fix up operations on the first, second and third data qubits using each of the classical bits.

10. The method of claim 9, further comprising preparing each of the routing qubits in a magic state, comprising:
preparing each of the routing qubits in a plus state;
performing a CCZ operation on the routing qubits;
performing CZ operations on pairs of neighboring routing qubits.

11. The method of claim 9, wherein performing classically controlled fix up operations on the first, second and third data qubits comprises:
measuring a first routing qubit to obtain a first classical bit that represents an on state, wherein the first routing qubit is prepared in a magic state and interacts with the first data qubit;
applying a first classically controlled swap operation to the second classical bit and third classical bit, wherein the seventh classical bit acts as a control for the first classically controlled swap operation;
applying a second classically controlled swap operation to the fifth classical bit and sixth classical bit, wherein the first classical bit acts as a control for the second classically controlled swap operation;
applying a third classically controlled swap operation to the eighth classical bit and ninth classical bit, wherein the fourth classical bit acts as a control for the third classically controlled swap operation;
applying multiple classically controlled Z operations to the first, second, and third data qubits, wherein each classically controlled Z operation uses one of the second, third, fifth, sixth, eighth or ninth classical bits as a control for the classically controlled Z operation;
applying multiple classically controlled-controlled Z operations to the first, second and third data qubits, wherein each classically controlled-controlled Z operation uses two of the first, fourth and seventh classical bits as controls for the classically controlled-controlled Z operation.

12. The method of claim 11, wherein applying multiple classically controlled Z operations to the first, second, and third data qubits, wherein each classically controlled Z operation uses one of the second, third, fifth, sixth, eighth or ninth classical bits as a control for the classically controlled Z operation, comprises:
applying a first classically controlled Z operation to the third data qubit, wherein the second classical bit acts as a control for the first classically controlled Z operation;
applying a second classically controlled Z operation to the second data qubit, wherein the third classical bit acts as a control for the second classically controlled Z operation;
applying a third classically controlled Z operation to the third data qubit, wherein the fifth classical bit acts as the control for the third classically controlled Z operation;
applying a fourth classically controlled Z operation to the first data qubit, wherein the sixth classical bit acts as the control for the fourth classically controlled Z operation;
applying a fifth classically controlled Z operation to the second data qubit, wherein the eighth classical bit acts as the control for the fifth classically controlled Z operation; and
applying a sixth classically controlled Z operation to the first data qubit, wherein the ninth classical bit acts as the control for the sixth classically controlled Z operation.

13. The method of claim 11, wherein applying multiple classically controlled-controlled Z operations to the first, second and third data qubits, wherein each classically controlled-controlled Z operation uses two of the first, fourth and seventh classical bits as controls for the classically controlled-controlled Z operation, comprises:
applying a first classically controlled-controlled Z operation to the first data qubit, wherein the first classical bit and fourth classical bit act as controls for the first classically controlled-controlled Z operation;
applying a second classically controlled-controlled Z operation to the second data qubit, wherein the fourth classical bit and seventh classical bit act as controls for the second classically controlled-controlled Z operation; and applying a third classically controlled-controlled Z operation to the third data qubit, wherein the first classical bit and seventh classical bit act as controls for the third classically controlled-controlled Z operation.

14. A quantum computation system comprising:
a plurality of data qubits;
a plurality of routing qubits; and
a plurality of control devices configured to operate the plurality of data qubits and the plurality of routing qubits;
wherein the quantum computation system is configured to perform operations comprising:
  measuring a fourth routing qubit to obtain a fourth classical bit that represents an on state, wherein the fourth routing qubit is prepared in a magic state and interacts with a second data qubit;
  measuring a seventh routing qubit to obtain a seventh classical bit that represents an on state, wherein the seventh routing qubit is prepared in a magic state and interacts with a third data qubit;
  applying a first Hadamard gate to a fifth routing qubit prepared in a magic state and applying a second Hadamard gate to a sixth routing qubit prepared in a magic state;
  measuring the fifth routing qubit using a Z basis measurement to obtain a fifth classical bit and measuring the sixth routing qubit using a Z basis measurement to obtain a sixth classical bit;
  applying a third Hadamard gate to an eighth routing qubit prepared in a magic state and applying a fourth Hadamard gate to a ninth routing qubit prepared in a magic state;
  measuring the eighth routing qubit using a Z basis measurement to obtain an eighth classical bit and measuring the ninth routing qubit using a Z basis measurement to obtain a ninth classical bit;
  applying a fifth Hadamard gate to a second routing qubit prepared in a magic state and applying a sixth Hadamard gate to a third routing qubit prepared in a magic state;
  measuring the second routing qubit using a Z basis measurement to obtain a second classical bit and measuring the third routing qubit using a Z basis measurement to obtain a third classical bit; and
  performing classically controlled fix up operations on the second and third data qubits using each of the classical bits.

15. The quantum computation system of claim 14, wherein the operations further comprise preparing each of the routing qubits in a magic state, comprising:
  preparing each of the routing qubits in a plus state;
  performing a CCZ operation on the routing qubits; and
  performing CZ operations on pairs of neighboring routing qubits.

16. The quantum computation system of claim 14, wherein performing classically controlled fix up operations on the second and third data qubits comprises:
  measuring a first routing qubit to obtain a first classical bit that represents an on state, wherein the first routing qubit is prepared in a magic state and interacts with a first data qubit;
  applying a first classically controlled swap operation to the second classical bit and third classical bit, wherein the seventh classical bit acts as a control for the first classically controlled swap operation;
  applying a second classically controlled swap operation to the fifth classical bit and sixth classical bit, wherein the first classical bit acts as a control for the second classically controlled swap operation;
  applying a third classically controlled swap operation to the eighth classical bit and ninth classical bit, wherein the fourth classical bit acts as a control for the third classically controlled swap operation;
  applying multiple classically controlled Z operations to the first, second, and third data qubits, wherein each classically controlled Z operation uses one of the second, third, fifth, sixth, eighth or ninth classical bits as a control for the classically controlled Z operation;
  applying multiple classically controlled-controlled Z operations to the first, second and third data qubits, wherein each classically controlled-controlled Z operation uses two of the first, fourth and seventh classical bits as controls for the classically controlled-controlled Z operation.

17. The quantum computation system of claim 16, wherein applying multiple classically controlled Z operations to the first, second, and third data qubits, wherein each classically controlled Z operation uses one of the second, third, fifth, sixth, eighth or ninth classical bits as a control for the classically controlled Z operation, comprises:
  applying a first classically controlled Z operation to the third data qubit, wherein the second classical bit acts as a control for the first classically controlled Z operation;
  applying a second classically controlled Z operation to the second data qubit, wherein the third classical bit acts as a control for the second classically controlled Z operation;
  applying a third classically controlled Z operation to the third data qubit, wherein the fifth classical bit acts as the control for the third classically controlled Z operation;
  applying a fourth classically controlled Z operation to the first data qubit, wherein the sixth classical bit acts as the control for the fourth classically controlled Z operation;
  applying a fifth classically controlled Z operation to the second data qubit, wherein the eighth classical bit acts as the control for the fifth classically controlled Z operation; and
  applying a sixth classically controlled Z operation to the first data qubit, wherein the ninth classical bit acts as the control for the sixth classically controlled Z operation.

18. The quantum computation system of claim 16, wherein applying multiple classically controlled-controlled Z operations to the first, second and third data qubits, wherein each classically controlled-controlled Z operation uses two of the first, fourth and seventh classical bits as controls for the classically controlled-controlled Z operation, comprises:
  applying a first classically controlled-controlled Z operation to the first data qubit, wherein the first classical bit and fourth classical bit act as controls for the first classically controlled-controlled Z operation;
  applying a second classically controlled-controlled Z operation to the second data qubit, wherein the fourth classical bit and seventh classical bit act as controls for the second classically controlled-controlled Z operation; and
  applying a third classically controlled-controlled Z operation to the third data qubit, wherein the first classical bit and seventh classical bit act as controls for the third classically controlled-controlled Z operation.

* * * * *